(12) United States Patent
Swenson et al.

(10) Patent No.: US 7,256,572 B2
(45) Date of Patent: *Aug. 14, 2007

(54) ELECTRIC-FIELD METER HAVING CURRENT COMPENSATION

(75) Inventors: Jody A. Swenson, Hyde Park, UT (US); William H. Beasley, Norman, OK (US); Leon G. Byerley, Tuscon, AZ (US); Ivan G. Bogoev, Hyde Park, UT (US)

(73) Assignee: Board of Regent of the University of Oklahoma, Norman, OK (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/502,138

(22) Filed: Aug. 10, 2006

(65) Prior Publication Data

US 2006/0279290 A1 Dec. 14, 2006

Related U.S. Application Data

(60) Division of application No. 10/808,648, filed on Mar. 25, 2004, now Pat. No. 7,109,698, which is a continuation-in-part of application No. 10/094,942, filed on Mar. 14, 2002, now Pat. No. 6,984,971.

(60) Provisional application No. 60/275,763, filed on Mar. 14, 2001.

(51) Int. Cl.
*G01R 29/12* (2006.01)
(52) U.S. Cl. ......................... 324/72; 324/458
(58) Field of Classification Search ................ 324/458, 324/457, 72, 681, 683, 667, 674, 76.39, 76.48, 324/76.62, 76.16
See application file for complete search history.

(56) References Cited

U.S. PATENT DOCUMENTS 1,919,215 A   7/1933   Gunn (Continued)

FOREIGN PATENT DOCUMENTS

SU         1251682 A1  * 11/1984

OTHER PUBLICATIONS

Wilson, C.T.R.; On a Portable Gold-leaf Electrometer for Low or High Potentials; Cambridge Philosophical Society; Jan. 31, 1906; pp. 184-189; vol. XIII, Part IV; Cambridge University Press.

(Continued)

*Primary Examiner*—Anjan Deb
(74) *Attorney, Agent, or Firm*—Dunlap, Codding & Rogers, P.C.

(57) ABSTRACT

An electric-field meter provided with a housing, an electrode assembly, a shield assembly, a movement assembly, a position detection assembly, a charge measurement circuit, and a leakage current compensation circuit. The electric-field meter can be characterized as a field mill, an induction voltmeter, an electrostatic fluxmeter or an agrimeter. The electrode assembly is selectively exposed to the electric field. The shield assembly alternately covers and exposes the electrode assembly to the electric field. The movement assembly has a source of motive force and a linkage operably connected to one of the shield assembly and the electrode assembly for alternately covering and exposing the electrode assembly to the electric field. The charge measurement circuit receives charge on the electrode assembly. The charge measurement circuit provides a charge detection signal indicative of the charge induced on the electrode assembly as the electrode assembly is selectively exposed to the electric field. A current compensation circuit is provided for offsetting an average leakage current at the input of the charge measurement circuit.

47 Claims, 10 Drawing Sheets

U.S. PATENT DOCUMENTS

| | | | |
|---|---|---|---|
| 2,449,068 | A | 9/1948 | Gunn |
| 2,587,156 | A | 2/1952 | Havenhill et al. |
| 2,815,483 | A | 12/1957 | Kaufman |
| 2,820,947 | A | 1/1958 | Gunn |
| 3,121,196 | A | 2/1964 | Kasemir |
| 3,188,472 | A | 6/1965 | Whipple, Jr. |
| 3,273,066 | A | 9/1966 | Ruhnke |
| 3,344,344 | A | 9/1967 | Wales, Jr. |
| 3,370,225 | A | 2/1968 | Winder |
| 3,449,668 | A | 6/1969 | Blackwell, et al. |
| 3,458,805 | A | 7/1969 | Kasemir |
| 3,519,927 | A | 7/1970 | Holt |
| 3,564,529 | A | 2/1971 | Kaufman et al. |
| 3,586,973 | A | 6/1971 | Lawton et al. |
| 3,611,127 | A | 10/1971 | Vosteen |
| 3,662,250 | A | 5/1972 | Piccone et al. |
| 3,727,125 | A | 4/1973 | Mourier |
| 3,812,419 | A * | 5/1974 | Kaunzinger et al. ........ 324/458 |
| 3,820,095 | A | 6/1974 | Wojtasinski et al. |
| 3,824,454 | A | 7/1974 | Stern et al. |
| 3,846,700 | A | 11/1974 | Sasaki et al. |
| 3,868,074 | A | 2/1975 | Hill |
| 3,916,605 | A | 11/1975 | Richards et al. |
| 3,917,996 | A | 11/1975 | Wagner et al. |
| 3,919,636 | A | 11/1975 | Few |
| 3,921,087 | A | 11/1975 | Vosteen |
| 3,925,726 | A | 12/1975 | Few |
| 3,935,532 | A | 1/1976 | Shuey et al. |
| 4,054,835 | A | 10/1977 | Los et al. |
| 4,055,798 | A | 10/1977 | Kato |
| 4,095,221 | A | 6/1978 | Slocum, Jr. |
| 4,101,825 | A | 7/1978 | Truax |
| 4,199,715 | A | 4/1980 | Hill |
| 4,277,745 | A | 7/1981 | Deno |
| 4,330,749 | A | 5/1982 | Eda et al. |
| 4,370,616 | A | 1/1983 | Williams |
| 4,422,037 | A | 12/1983 | Coleman |
| 4,424,481 | A * | 1/1984 | Laroche et al. ............... 324/72 |
| 4,433,297 | A | 2/1984 | Buchheit |
| 4,465,969 | A * | 8/1984 | Tada et al. ..................... 324/96 |
| 4,506,211 | A | 3/1985 | Coleman |
| 4,553,099 | A | 11/1985 | Kasahara et al. |
| 4,642,559 | A | 2/1987 | Slough |
| 4,672,305 | A | 6/1987 | Coleman |
| 4,683,436 | A | 7/1987 | Suzuki |
| 4,803,421 | A | 2/1989 | Ostrander |
| 4,836,581 | A | 6/1989 | Guilloteau |
| 5,065,102 | A * | 11/1991 | Takanashi et al. .......... 324/452 |
| 5,151,659 | A * | 9/1992 | Tanaka et al. .............. 324/458 |
| 5,315,232 | A * | 5/1994 | Stewart ....................... 324/72 |
| 6,353,324 | B1 | 3/2002 | Uber et al. |
| 6,608,483 | B1 | 8/2003 | Hill |
| 6,956,417 | B2 | 10/2005 | Bernstein et al. |
| 7,109,698 | B2 * | 9/2006 | Swenson et al. .............. 324/72 |
| 2003/0030446 | A1 | 2/2003 | Wang et al. |

OTHER PUBLICATIONS

Wilson, C.T.R.; On the Measurement of the Earth-Air Current and on the Origin of Atmospheric Electricity; Cambridge Philosophical Society; Nov. 5, 1906; pp. 363-382; vol. XIII, Part VI; Cambridge University Press.

Simpson, George C.; Earth-Air Electric Currents; The London, Edinburgh, and Dublin Philosophical Magazine and Journal of Science; May, 1910; pp. 715-725; Sixth Series.

Wilson, C.T.R.; On Some Determinations of the Sign and Magnitude of Electric Discharges in Lightning Flashes; Proceedings of the Royal Society; Mathematical and Physical Sciences; Jun. 3, 1916; pp. 555-574; Ser. A, vol. 92, No. A 644.

Wilson, C.T.R.; Investigations on Lightning Discharges and on the Electric Field of Thunderstorms; Aug. 27, 1920; pp. 73-115; Philosophical Transactions of the Royal Society of London; Ser. A, vol. 221.

Whipple, F.J.W.; On the Association of the Diurnal Variation of Electric Potential Gradient in Fine Weather with the Distribution of Thunderstorms Over the Globe; Quarterly Journal of the Royal Meteorological Society; Jan. 1929; pp. 1-15; vol. 55, No. 229.

Whipple, F.J.W.; Potential Gradient and Atmospheric Pollution: The Influence of "Summer Time"; Aug. 6, 1929; pp. 351-362.

Wilson, C.T.R.; Some Thundercloud Problems; Journal of the Franklin Institute; Jul. 1929; pp. 1-12; vol. 208, No. 1; Lancaster Press, Inc.

Kirkpatrick, Paul and Miyake, Iwao; A Generating Voltmeter for the Measurement of High Potentials; The Review of Scientific Instruments; Jan. 1932; pp. 1-8; vol. 3, No. 1.

Kirkpatrick, Paul; Further Development of the Rotary Voltmeter; Apr. 4, 1932; pp. 430-438.

Gunn, Ross; Principles of a New Portable Electrometer; Apr. 15, 1932; pp. 307-313; vol. 40.

Harnwell, G.P. and Van Voorhis, S.N.; An Electrostatic Generating Voltmeter; R.S.I.; Oct. 1933; pp. 540-541.

Henderson, Joseph E., Goss, Wilbur H., Rose, John E.; The Use of the Rotary Voltmeter for Measurements up to 830 kilovolts; R.S.I.; Mar. 1935; pp. 63-65; vol. 6.

Gunn, Ross; The Electricity of Rain and Thunderstorms; Terrestrial Magnetism & Atmospheric Electricity; 1935; pp. 79-106; vol. 40, No. 1.

Van Atta, L.C., Northrup, D.L., Van Atta, C.M. and Van De Graaff, R.J.; The Design, Operation, and Performance of the Round Hill Electrostatic Generator; Physical Review; May 15, 1936; pp. 761-776; vol. 49.

Macky, W.A.; The Measurement of Normal Atmospheric-Electric Potential-Gradients Using a Valve-Electrometer; Terrestrial Magnetism and Atmospheric Electricity; Mar. 1937; pp. 77-86; vol. 42, No. 1.

Workman, E.J. and Holzer, R.E.; A Recording Generating Voltmeter for the Study of Atmospheric Electricity; R.S.I.; May 1939; pp. 160-163; vol. 10.

Gunn, Ross; The Electrical Charge on Precipitation at Various Altitudes and its Relation to Thunderstorms; Physical Review; Feb. 1, 1947; pp. 181-186; vol. 71, No. 3.

Waddel, R.C.; An Electric Field Meter for Use on Airplanes; The Review of Scientific Instruments; Jan. 1948; pp. 31-35; vol. 19, No. 1.

Simpson, G.C.; Atmospheric Electricity During Disturbed Weather; Terrestrial Magnetism and Atmospheric Electricity; Mar. 1948; pp. 27-33; vol. 53, No. 1.

Malan, D.J., and Schonland, B.F.J.; An Electrostatic Fluxmeter of Short Response-time for use in Studies of Transient Field-Changes; The Proceedings of the Physical Society, Section B; Jun. 1, 1950; pp. 402-408; vol. 63, Part 6, No. 366B.

Chalmers, J. Alan; Negative Electric Field in Mist and Fog; Journal of Atmospheric and Terrestrial Physics; 1952; pp. 155-159; vol. 2; Pergamon Press Ltd., London.

Cross, A.S.; Two Electrostatic Field-Meters; British Journal of Applied Physics; Mar. 1953; pp. S 47-S 50; Supplement No. 2.

Chalmers, J. Alan; The Agrimeter for Continuous Recording of the Atmospheric Electric Field; Journal of Atmospheric and Terrestrial Physics; 1953; pp. 124-128; vol. 4; Pergamon Press Ltd., London.

Smith, L.G.; An Electric Field Meter with Extended Frequency Range; The Review of Scientific Instruments; May 1954; pp. 510-513; vol. 25, No. 5.

Mapleson, W.W. and Whitlock, W.S.; Apparatus for the Accurate and Continuous Measurement of the Earth's Electric Field; Journal of Atmospheric and Terrestrial Physics; 1955; pp. 61-72; vol. 7; Pergamon Press Ltd., London.

Whitlock, W.S. and Chalmers, J. Alan; Short-Period Variations in the Atmospheric Electric Potential Gradient; 1956; pp. 325-336.

Clark, John F.; Airborne Measurement of Atmospheric Potential Gradient; Journal of Geophysical Research; Dec. 1957; pp. 617-628; vol. 62, No. 4.

Jones, O.C., Maddever, R.S. and Sanders, J.H.; Radiosonde Measurement of Vertical Electrical Field and Polar Conductivity; Journal of Scientific Instruments; Jan. 1959; pp. 24-28; vol. 36.

Vonnegut, B.; Moore, C.B. and Harris, C.K.; Agrimeter for Measurement of Atmospheric Electrical Potential Gradient; Journal of Meteorology; 1961; pp. 812-815; vol. 18.

Collin, H.L.; Sign Discrimination in Field Mills; Journal of Atmospheric and Terrestrial Physics; Aug. 1962; pp. 743-745; vol. 24; Pergamon Press, London.

Winn, William P., and Byerley, L.G., III; Electric Field Growth in Thunderclouds; Quarterly Journal of the Royal Meteorological Society; Oct. 1975; pp. 979-994; vol. 101, No. 430.

Thompson, James E.; Kristiansen, M., and Hagler, Marion O.; Optical Measurement of High Electric and Magnetic Field; IEEE Transactions on Instrumentation and Measurement; Mar. 1976; pp. 1-7; vol. 25, No. 1.

Toland, R.B. and Vonnegut, B.; Measurement of Maximum Electric Field Intensities Over Water During Thunderstorms; Journal of Geophysical Research; Jan. 20, 1977; pp. 438-440; vol. 82, No. 3.

Cummings, Mary R.; Nicholson, Howard W., Jr. and Porto, Deborah R.; Measurement of the Atmospheric Electrostatic Potential Gradient Near Sea Level; American Journal of Physics; Dec. 1981; pp. 1176-1180, vol. 49, No. 12.

Vosteen, James R. and Vosteen, William E.; The Feedback Vibrating Capacitor Fieldmeter; 1991; pp. 103.1-103.13.

Malan, D.J.; Experimental Methods of Measuring the Potential Gradients of Thunderclouds; Physics of Lightning; pp. 37-104; The English Universities Press, Ltd., London.

Goto, Miyoji; A Newly Designed Differential Electrometer and its Application to the Simultaneous Measurement of Air Earth Current and Potential Gradient; pp. 22-23.

Wilson, C.T.R.; On the Ionisation of Atmospheric Air; 1901; pp. 151-161.

Rust, W. David and MacGorman, Donald R.; Techniques for Measuring Electrical Parameters of Thunderstorms; Instruments and Techniques for Thunderstorm Observation and Analysis; pp. 91-244.

Nelson, B.N.; Menzel, C., and Digiuseppe, T.G.; A Fiber-Optic Electric Field Sensor for Lightning Research.

Mission Instruments Co., Presents the EFS 1000 Field Mill.

Lightning Detector Type VSL 1.

Atmospheric Research Systems, Inc.; Electric Field Mill.

Atmospheric Research Systems, Inc.; Electric Field Mill Network.

Monroe Electronics, Inc.; Reference Supply/Pulse Generator; Model 241.

Taylor, D.M.; Secker, P.E.; Industrial Electrostatics; Fundamentals and Measurements; 1994; Chap 4; pp. 130-132.

* cited by examiner

ELECTRIC-FIELD METER HAVING CURRENT COMPENSATION

CROSS-REFERENCE TO RELATED APPLICATIONS

This patent application is a divisional of U.S. Ser. No. 10/808,648, filed Mar. 25, 2004, now U.S. Pat. No. 7,109,698B2, issue Sep. 19, 2006, which is a continuation-in-part of U.S. Ser. No. 10/094,942, filed Mar. 14, 2002, now U.S. Pat. No. 6,984,971B1, issued Jan. 10, 2006, which claims priority to the provisional patent application identified by U.S. Ser. No. 60/275,763, filed on Mar. 14, 2001, the entire contents of U.S. Ser. Nos. 10/094,942, 10/808,648, and 60/275,763 are hereby expressly incorporated in their entirety by reference.

STATEMENT REGARDING FEDERALLY SPONSORED RESEARCH AND DEVELOPMENT

Portions of the invention may have been funded under NSF Grant ATM-9724594.

BACKGROUND OF THE INVENTION

Lightning is a well known natural hazard. Every year in the United States, lightning kills approximately one hundred people and injures on the order of a thousand. Approximately 50 million cloud-to-ground lightning discharges occur each year in the U.S. Damage to equipment and disruption of commercial and industrial operations is measured in billions of dollars. For these reasons, and for many safety-related and equipment protection purposes, it is desirable to provide objective information about impending electrical storms, active thunderstorms and expiring thunderstorms.

Instruments known as electric-field meters are currently used to measure atmospheric electric fields at the surface of the earth. Almost all such electric-field meters are based on a design originally developed by C. T. R. Wilson in the early part of the 20th Century. One of the prior art electric-field meters developed by Wilson used a flat circular metal plate mounted flush with, but well insulated from the ground. The flat plate was connected to a gold-leaf electrometer. To make a measurement of electric field with this instrument, a grounded cover was placed over the sensor plate (thus shielding the sensor plate from the ambient electric field) and a zero for the electrometer was determined. Then the cover was removed, allowing charge to be induced on the plate and causing a deflection of the electrometer leaves. By means of a calibrated variable capacitor and a power supply, Wilson was able to null out the induced charge and thereby determine the electric field at the sensor plate when it was uncovered. All mechanized electric-field meters that followed have been, essentially and simply, variations with varying degrees of automation of the basic concepts employed by Wilson.

Mechanized electrical field meters have been employed for atmospheric research and thunderstorm warning for about seventy years. Mechanized field meters have been used as stand-alone instruments and in networks in which multiple individual sensors are installed some distance apart on the surface of the Earth to give measurements of electric fields over a wide area.

Multiple field meters in a network have been employed at the NASA Kennedy Space Center for more than 20 years as one component of a decision support system to inform official judgement as to propriety of fueling operations, launch, etc. Single field meters are employed at high-risk installations such as armament caches, etc. The cost of commercial field meters currently available is high, they have great electrical power requirements, and they usually need frequent preventive and periodic maintenance. These disadvantages preclude widespread application of commercially available field meters.

More specifically, the prior art electric-field meters suffer from at least three problems which make their wide spread use generally too costly. These three factors are relatively high power consumption, difficult calibration procedure, and stringent requirements for frequent maintenance. For example, on all high input impedance electric-field meters it is necessary to clean the insulators and/or the electrodes of the insulated sensing electrode assembly periodically. Cleaning is necessary because when the insulators become covered with films of dust, moisture and salt spray, conductive paths can form, defeating the purpose of the insulators. Over time, the sensing electrode assembly also becomes covered with a film of dust and salt spray. In the prior art, the cleaning operation is difficult because the prior art electric-field meters require extensive and complex disassembly of the instrument to remove electrodes and thereby clean insulators and electrodes. The disassembly of the prior art electric-field meters for electrode and insulator cleaning thus requires a highly skilled technician adding considerably to the on-going expenses associated with the electric-field meter.

Commercial field meters typically consume tens to hundreds of watts of electrical power. Such high power consumption precludes or discourages application of commercial field meters on most of the existing remote, solar-powered weather stations where electrical power is severely limited.

Commercial field meters, when mounted for practical use in elevated configurations, e.g., above ground, on top of buildings, on weather station masts or poles, for which the electric field enhancement factor is unknown must be properly adjusted to compensate for the mechanically increased gain due to the mounting. Typically this correction is performed by changing the value of a resistor or by adjusting a variable resistor inside the instrument to effect a reduction of the electrical gain of the instrument by the same factor that the gain is enhanced by the mounting arrangement. This gain adjustment process typically involves disassembly of the instrument to gain access to electronic components. This process also typically involves a skilled technician and involves risks of opening and improperly closing sealed enclosures in the field.

Prior-art field meters suffer from two types of uncorrected errors that change with time, temperature, humidity and atmospheric pollutants. Typical instruments that predate the present invention have a zero-signal output (defined as the output value of the field meter with an imposed electric field of zero) that is typically set during manufacture but which subsequently changes in an unknown way with use and time. Because valuable information about atmospheric electrical conditions can be obtained around zero and at the zero-crossing, i.e., when the electric field reverses polarity, there is a significant advantage in having a zero-signal reading that is known with confidence throughout the operating life of the instrument.

Prior-art field meters also suffer from variations in leakage current at the charge-amplifier input due to conduction across insulators associated with the sense electrode and the circuitry used for charge measurement. For prior-art field meters at the place and time of manufacture, the average leakage current at the charge-amplifier input is typically negligible but it can worsen over time with various atmospheric conditions. The average leakage current in prior-art field meters is an unknown variable that can degrade an instrument to a state of improper operation without warning. Uncorrected changes in average leakage currents may cause measurement errors in the electric field, possibly leading to improper assessment of atmospheric electrical threats.

Field meters that suffer from unknown and uncorrected zero offsets and average leakage currents do not always provide information of high quality over long periods of use and such field meters typically require labor intensive testing, adjusting and cleaning at times that have to be determined empirically. Here we teach methods for making field meters that measure and correct zero-signal offset errors and errors due to leakage current at the charge-amplifier input as part of each measurement cycle so that every measurement made and reported is of high quality.

Thus, a need exists in the art for an electric-field meter with low operating power requirements, ease of installation and field calibration, minimal on-going maintenance expenses, and continuous and automatic error detection and correction. It is to such an improved electric-field meter that the present invention is directed.

DETAILED DESCRIPTION OF THE INVENTION

Figure 1:
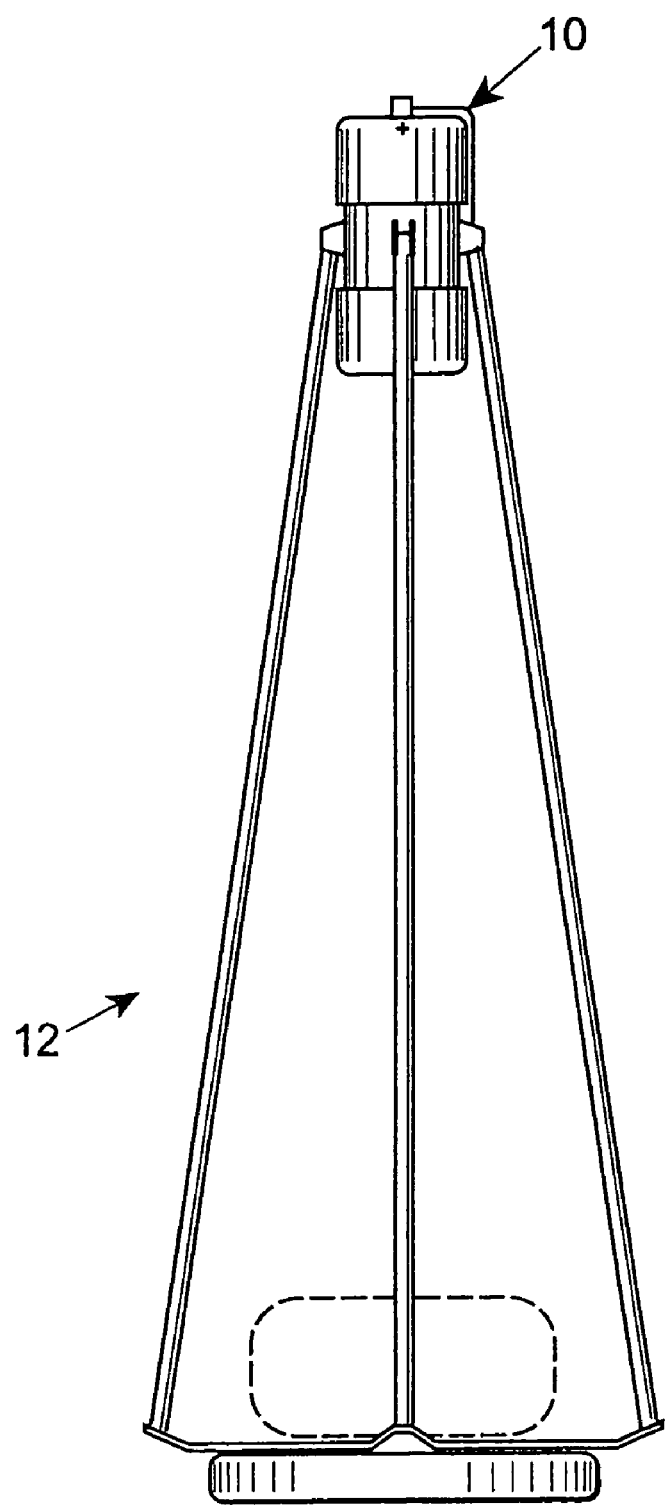
FIG. 1 is a side elevational view of an electric-field meter constructed in accordance with the present invention, and installed in typical fashion.

The present invention is directed to improvements in electric-field meters to allow more cost effective and reliable monitoring of atmospheric electrification at single or multiple remote stations. The electric-field meter of the present invention exploits the physical principle that charge is induced on a conductor placed in an electric field. By alternately covering and exposing a conducting and properly insulated electrode assembly, induced charge flows back and forth to the successively exposed, then unexposed, electrode assembly through charge-sensing electronic circuits. The electronic signal produced is indicative of (e.g., proportional to) the applied electric field at the electrode assembly when exposed. Thus, the electric-field meters can be used for measuring a magnitude and/or a polarity of a steady or changing electric field.

The electric-field meters of the present invention can be used either individually or as a part of a network for research or for widespread monitoring and warning of impending electrical storms at the following exemplary locations and activities: a golf course, an airport, a marina, an agricultural operation, an offshore oil rig, a hiking trail, an outdoor stadium (football, soccer, baseball, track and field), a theme park, a swimming pool, explosive and munition handling, or any other outdoor operation, such as loading of freight on an aircraft, fueling or the like. When more than one of the electric-field meters of the present invention are utilized, data from separate electric-field meters arranged in a network or grid can be taken to build contours of electric field at ground level as a function of time for operational purposes (hazard warnings, all-clear notice, or the like) and for meteorological research. The electric-field meter can be used for measurement of atmospheric electric fields for a variety of purposes, such as thunderstorm research, early warning of impending lightning, air pollution monitoring, industrial and process control, industrial safety, high-voltage laboratories, physics experiments and educational demonstrations, and intrusion detection and alarm systems.

Some of the improvements to the electric-field meters in accordance with the present invention can be characterized according to the following classes: mechanical gain adjustment assemblies, insulated electrode assemblies, rotating electrical contact assemblies, and in some embodiments, elimination of the need for such assemblies, and position detection assemblies. Each of these improvements can be used individually or in combination with other improvements discussed herein to achieve improved performance in comparison to prior art electric-field meters.

The mechanical gain adjustment assemblies and the insulated electrode assemblies 1) permit less expensive and more reliable electric-field meters to be constructed, and 2) simplify installation procedures for electric-field meters.

The electrical contact assemblies of the present invention, or the elimination of the need for them in some embodiments of the present invention, improve the reliability of electric-field meters and also improve the grounding of or signal conduction from rotating or moving parts thereby improving the signal-to noise ratio of the output of the electric-field meter. The position detection assemblies greatly reduce electrical power consumption as well as complexity of setup and maintenance of electric-field meters constructed in accordance with the present invention relative to the prior art electric-field meters.

Various devices are described herein for implementing each of the improvements discussed above. However, it should be understood that each of the improvements can be implemented in various manners so long as the functions described herein are achieved.

Referring now to FIG. 1, shown therein and designated by a reference numeral 10 is an electric-field meter constructed in accordance with the present invention. In one preferred embodiment, the electric-field meter 10 requires power of only six hundred (600) milliwatts or less. The electric-field meter 10 can be provided with a complete internal battery-powered sub-system that enables the electric-field meter 10 to operate for extended periods of time while remaining independent of external power sources. Alternatively, the electric-field meter 10 may be powered by a small, inexpensive solar panel that can provide adequate recharge of sealed, internal lead-acid (or other types) batteries, for example, for unattended long term operation. The prior art electric-field meters discussed in the background of the present invention typically require tens to hundreds of watts. Thus, the electric-field meter 10 is a substantial improvement over the prior art electric-field meters.

As shown in FIG. 1, the electric-field meter 10 can be mounted and supported by a mounting device 12. The electric-field meter 10 is preferably mounted on the mounting device 12 in an "inverted" position wherein an electrode assembly of the electric-field meter faces the ground so as to provide some protection for the electrode assembly from the elements, such as rain, snow, hail and ice. However, the electric-field meter 10 can be mounted to face upwards.

Mounting methods, such as the mounting device 12 for supporting the electric-field meter 10 are well known in the art. Thus, no more comments are deemed necessary to teach one of ordinary skill in the art how to construct and/or use a mounting device, such as the mounting device 12. The present invention is not limited to any particular type of mounting device.

Figure 2:
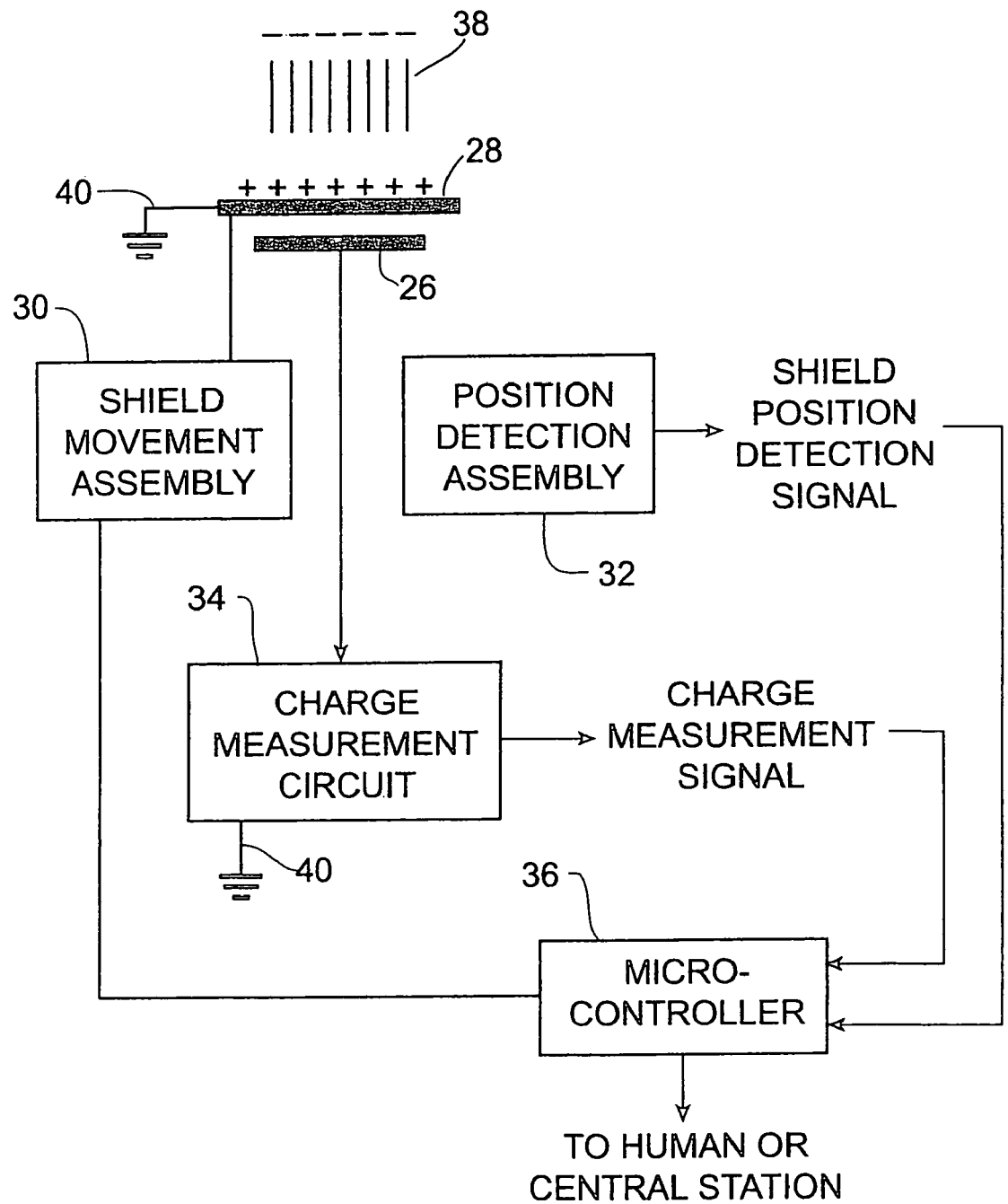
FIG. 2 is a block diagram of the electric-field meter when the electric-field meter is characterized as a field mill.

Referring now to FIG. 2, shown therein, in block diagram form, is one preferred embodiment of the electric-field meter 10. The electric-field meter 10 described hereinafter is also known as a "field mill". However, as will be discussed in more detail below with reference to FIGS. 2A, 2B and 2C it should be understood that the present invention is equally adapted to other electromechanical electric-field sensing instruments, such as electrostatic fluxmeters (FIG. 2B) induction voltmeters (FIG. 2A) and agrimeters (FIG. 2C), which share the common problems of calibration, making proper reliable contact with moving or rotating conductors, achieving and maintaining proper insulation of signal carrying conductors, correcting for signal modification due to non-ideal mounting configuration and detecting the position of moving conductors for the purpose of synchronous rectification.

In general, the electric-field meter 10 shown in FIG. 2 is provided with one or more electrode assembly 26, a shield assembly 28, a movement assembly 30, one or more position detection assembly 32, a charge measurement circuit 34, and a microcontroller 36 with an analog-to-digital converter.

Figure 4:
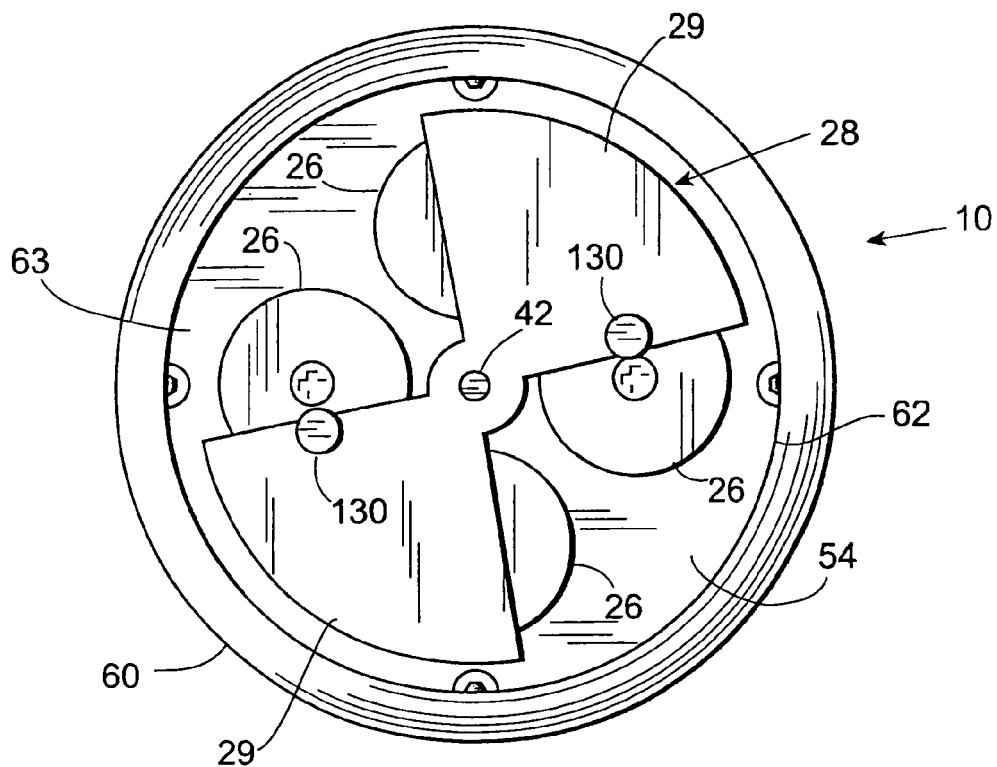
FIG. 4 is a bottom plan view of the electric-field meter depicted in FIG. 3.

In the field-mill implementation, the electrode assembly 26 is maintained in a stationary position and is selectively exposed to an electric field 38. Charge is induced on the electrode assembly 26 when the electrode assembly 26 is exposed to the electric field 38. Charge passes to ground from the electrode assembly 26 when the electrode assembly 26 is shielded from the electric field 38. The electric-field meter 10 can be provided with one or a plurality of electrode assemblies 26 preferably mounted in a symmetrical or evenly spaced relationship. For example, as shown in FIG. 4, the electric-field meter 10 has four electrode assemblies 26 with each of the electrode assemblies 26 mounted 90 degrees apart and in which opposing pairs are electrically common.

When the electric-field meter is a "field mill", the shield assembly 28 is maintained at a ground reference potential 40 and is movable with respect to the electrode assembly 26 through a predetermined path for alternately covering and exposing the electrode assembly 26 to the electric field 38. In this example, the shield assembly 28 is provided with one or more vanes 29 (FIG. 4), but the shield assembly 28 can take whatever form is needed for covering and exposing the electrode assembly 26.

The movement assembly 30 has a linkage 42 operably connected to the shield assembly 28 for moving the shield assembly 28 with respect to the electrode assembly 26. The linkage 42 can be a mechanical linkage, such as the shaft of a motor. The movement of the shield assembly 28 by the movement assembly 30 alternately covers and exposes the electrode assembly 26 to the electric field 38.

The movement assembly 30 can move the shield assembly 28 in a rotary manner, a reciprocating manner, or an oscillatory manner. The rotary manner of movement of the shield assembly 28 refers to movement of the shield assembly 28 in only one direction through a closed path encompassing at least 360 degrees. The movement assembly 30 providing the rotary manner of movement of the shield assembly 28 can be a stepper motor, a DC brushed motor, a DC brushless motor, a DC servo motor, a solenoid, a rotary actuator, or a clockwork-spring-like mechanism, or any of a variety of single or multiphase AC motors.

The reciprocating manner of movement refers to linear or rotary motion involving back and forth movement, up and down movement or the like. In the case of rotary reciprocating motion, the shield assembly 28 may move through any angle desired up to the limit imposed by an electrical contact assembly discussed herein below with reference to FIGS. 13-17. The reciprocating manner of movement can be implemented with a stepper motor, a DC brushed motor, a DC brushless motor, a solenoid(s), a rotary actuator, a clockwork-spring-like mechanism, a linear actuator, a DC motor with servo-control, a mechanical spring with an assist from an electromechanical device, an air motor, or a fluid drive. The oscillatory manner of movement refers to the shield assembly 28 and movement assembly 30 being a driven mechanical oscillator, i.e., a mechanical system having a natural frequency of oscillation.

The stepper motor provides many advantages over other ways of moving the shield assembly 28. That is, the stepper motor allows for (1) low-noise brushless DC operation and allows for rapid, repeatable motion of the shield assembly 28; (2) electromagnetic braking of the shield assembly 28 and precise repeatable repositioning of the shield assembly 28; (3) very low average power consumption because the stepping motor coils can be de-energized after a move is complete; (4) complete symmetry of covering and uncovering "moves" that can be used to advantage for improved signal processing; and (5) control with only two I/O lines from the microcontroller 36 thereby providing economy in hardware and software. The stepper motor can give a reduction in number of parts and thereby a reduction in cost to manufacture and cost to maintain and an increase in reliability.

In the reciprocating and oscillating manners of movement, there optionally may be a pause (hereinafter referred to herein as "dead time") between movement of the shield assembly such that 1) the shield assembly 28 is not moving and 2) the shield assembly 28 is not covering the electrode assembly 26. dE/dt signals can optionally be received by the charge measurement circuit 34 and monitored during dead time when the electrode assembly 26 is exposed to electric-field change signals. This in effect allows the electric-field meter 10 to function as an electric-field-change meter, which monitors the environment for changes of electric-field during dead time. Using the electric-field meter 10 during dead time as the electric-field-change meter makes the electric-field meter 10 responsive to both electric field changes caused by lightning, and the relatively slow variations in electric-field changes associated with growth and decay of as well as advection charge accumulations in clouds. Both of these functions are useful if the electric-field meter 10 is being used for monitoring thunderstorms. For example, the electric-field meter 10 can be used for counting lightning-like field changes, watching for lightning and other large field changes, and other conditions which are indicative of a thunderstorm threat.

The position detection assembly 32 monitors the position of at least a portion of the shield assembly 28 and outputs a shield position detection signal. The shield position detection signal indicates the portion of the shield assembly 28 for typically determining the covering or uncovering of the electrode assembly 26 by the shield assembly 28. The charge measurement circuit 34 is connected to the electrode assembly 26 and produces a charge measurement signal indicative of the charge accumulated, or, released by the electrode assembly 26. The charge measurement circuit 34 can be implemented with a charge amplifier, or with a voltage amplifier that measures the voltage drop across a resistor connected between the electrode assembly 26 and the ground reference potential 40.

The microcontroller 36 receives the shield position detection signal and the charge measurement signal and determines the sign and magnitude of the electric field 38 based on the shield position detection signal and the charge measurement signal.

The microcontroller 36 outputs a signal indicative of the electric field 38 to a meter, a computer system, or a dedicated display located locally or at a central monitoring station. The signal output by the microcontroller 36 can be either an analog or a digital signal, or both. Optionally, the electric-field meter 10 can be provided with a fiber-optic communication link for communicating the signal output from the microcontroller 36 to the central monitoring station. The type of signal output by the microcontroller 36 can vary widely depending on the application. In one preferred embodiment, the output from the microcontroller 36 is provided as a digital representation of an analog signal with full-scale equal to plus or minus 2.5 volts which corresponds to plus or minus 10 kilovolts per meter of electric field.

When the movement assembly 30 is the stepper motor, the microcontroller 36 is typically used to control the stepper motor, and to sample the charge measurement circuit 34 (in conjunction with an A/D converter) for performing a sampling of the peak output signal from the charge measurement circuit 34 on both covering and uncovering operations. This scheme of using an A/D converter to digitize the peak voltage out of the charge measurement circuit 34 provides a sample and hold function with infinite hold time. This feature greatly relaxes the requirements for perfect insulators and long amplifier decay times for the charge measurement circuit 34, thus reducing maintenance requirements even further, beyond the improvements afforded by the mechanical designs of the present invention.

This simple combination of features (moving the shield assembly 28 with a microprocessor-controlled stepper motor detecting position and sampling the peak voltage resulting) replaces the entire synchronous rectifier portion of a conventional field meter. The electric-field meter 10 is thus automatically synchronous. Since the microcontroller 36 causes the covering and uncovering motions, the microcontroller 36 knows at all times the position of the shield assembly 28 so that the output signal of the charge measurement circuit 34 can always be sampled at the proper time and thus the proper sign can be assigned to the electric field measurement.

Figure 2A:
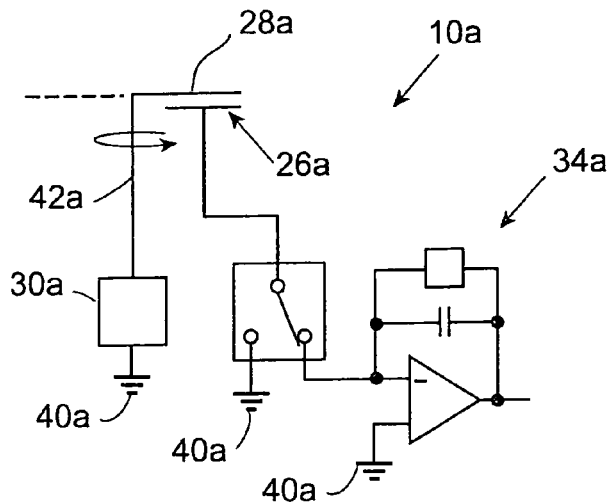
FIG. 2A is a block diagram of the electric-field meter when the electric-field meter is characterized as an induction voltmeter.
Figure 2B:
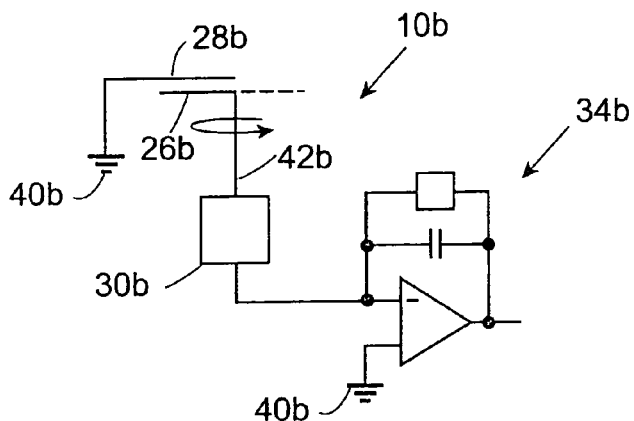
FIG. 2B is a block diagram of the electric-field meter when the electric-field meter is characterized as an electrostatic fluxmeter.
Figure 2C:
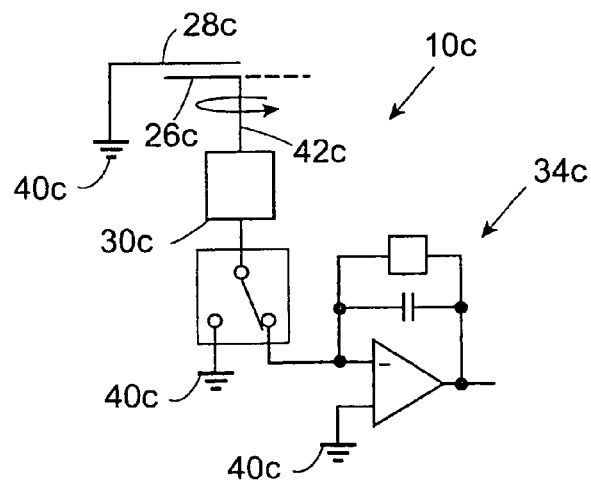
FIG. 2C is a block diagram of the electric-field meter when the electric-field meter is characterized as an agrimeter.

As shown in FIGS. 2, 2A, 2B, and 2C, the electric-field meter 10 can be characterized as a field mill (FIG. 2), an induction voltmeter 10a (FIG. 2A), an electrostatic fluxmeter 10b (FIG. 2B), or an agrimeter 10c (FIG. 2C). The characterization of the electric-field meter 10 as the field mill 10, the electrostatic fluxmeter 10b, the induction voltmeter 10a or the agrimeter 10c depends on the relative movement and grounding of the shield assembly 28 and the electrode assembly 26 (as will be discussed below). The making and using of field mills, electrostatic fluxmeters, induction voltmeters and agrimeters is well known in the art. For purposes of brevity, the induction voltmeter 10a, electrostatic fluxmeter 10b and agrimeter 10c will only be shown schematically. However, it should be understood that one skilled in the art will be readily able to make and use the induction voltmeter 10a, electrostatic fluxmeter 10b and agrimeter 10c based on the description set forth in the present patent application. For purposes of brevity, similar components between the electric-field meter 10, the induction voltmeter 10a, electrostatic fluxmeter 10b and agrimeter 10c are provided with similar numerical prefixes, and different alphabetic suffixes.

The field mill 10 has the movable shield assembly 28 that is held at the ground reference potential 40. The movable shield assembly 28 alternately exposes and covers the electrode assembly 26 which is connected to the ground reference potential 40 through the charge measurement circuit 34. In early implementations, field mills measured the alternating potential difference developed across a resistor as charge on the electrode assembly 26 passed to and from the ground reference potential 40. More modern implementations use an operational amplifier in the charge measurement circuit 34 to hold the electrode assembly 26 near the ground reference potential 40 and to perform charge-to-voltage conversion.

As shown in FIG. 2A, the induction voltmeter 10a is similar to the field mill except that the electrode assembly 26a is alternately connected to the ground reference potential 40a when exposed and to the charge measurement circuit 34a when shielded.

As shown in FIG. 2B, the electrostatic fluxmeter 10b is provided with an electrode assembly 26b which is movable through a predetermined path, and the shield assembly 28b is maintained at the ground reference potential 40b. The shield assembly 28b is maintained in a stationary position adjacent the predetermined path of the electrode assembly 26b to alternately cover and expose the electrode assembly 26b to the electric field when the electrode assembly 26b moves relative to the shield assembly 28b. The electrode assembly 26b is connected to the ground reference potential 40b through the charge measurement circuit 34b.

As shown in FIG. 2C, the agrimeter 10c is similar to the electrostatic fluxmeter 10b except that an electrode assembly 26c is alternately connected to the ground reference potential 40c when exposed and to the charge measurement circuit 34c when shielded.

Mechanical Gain Adjustment

Figure 3:
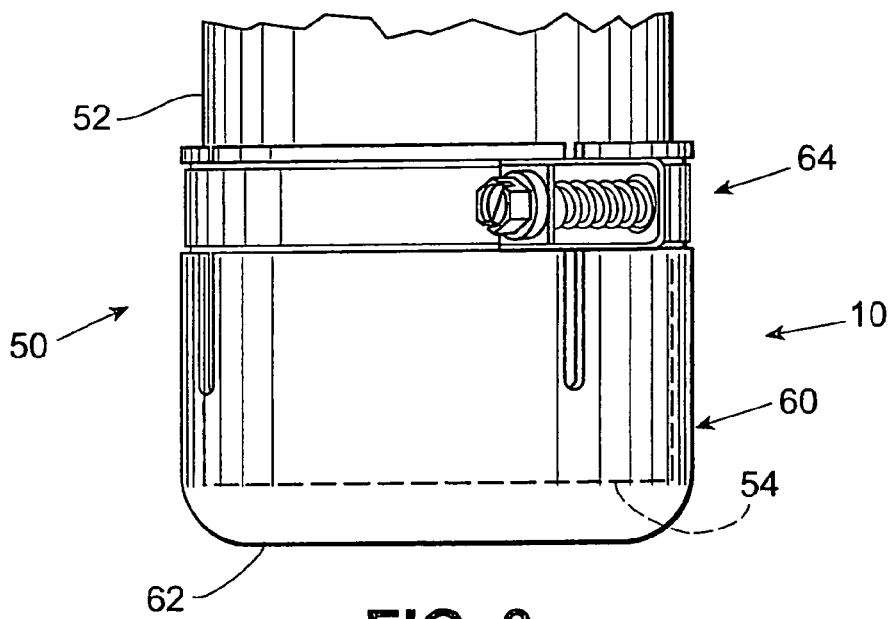
FIG. 3 is a perspective view showing a lower portion of one embodiment of the electric-field meter.

As shown in FIG. 3, in accordance with the present invention, the electric-field meter 10 can be provided with a mechanical gain adjustment assembly 50 for adjusting the effective area of the electrode assembly 26. Typically, the mechanical gain adjustment assembly 50 is utilized for correcting the signal augmentation that results from elevating and inverting the electric-field meter 10 above the surface of the Earth.

For example, it is usually desirable to know the actual electric field that exists at ground level. However, to reduce the effects of precipitation splash, mud, dust, insects, plant growth etc., the electric-field meter 10 is typically mounted on the mounting device 12 in the elevated and inverted position, resulting in an increase or enhancement of the actual electric field.

A variety of different embodiments of the mechanical gain adjustment assembly 50 will be discussed below. In each of the embodiments, the mechanical gain adjustment assemblies 50 vary the effective "aperture" of the electric-field meter 10 to mechanically vary, i.e., augment or reduce, the exposure of the electrode assembly 26 to the electric field. The effective aperture can be adjusted manually by an operator who has knowledge of how much the gain of the electric-field meter 10 needs to be changed.

Shown in FIG. 3 is a perspective view of a lower portion of one embodiment of the electric-field meter 10. The electric-field meter 10 includes a housing 52 at least partially constructed of a conductive material. As shown in FIG. 4, the housing 2 has a lower end 54. The electrode assembly 26, and the shield assembly 28 are positioned on the lower end 54.

In this embodiment, the mechanical gain adjustment assembly 50 includes a shroud 60 having an open end 62. The open end 62 of the shroud 60 defines an aperture 63 that permits exposure of the insulated electrode assemblies 26 to the electric field 38. The shroud 60 surrounds the housing 52 and is affixed to provide lengthwise adjustment between the shroud 60 and the housing 52. The lengthwise adjustment permits the open end 62 of the shroud 60 to extend past the lower end 54 of the housing 52 such that the distance between the open end 62 and the electrode assembly 26 can be adjusted. This adjustment mechanically increases or reduces the electric-field to which the electrode assembly 26 is exposed. The mechanical gain adjustment assembly 50 is also provided with a securing mechanism 64 for selectively permitting and preventing movement of the shroud 60 on the housing 52 after a desired position has been set. The securing mechanism 64 can be any device capable of selectively permitting and preventing movement of the shroud 60 relative to the housing 52. For example, the securing mechanism 64 can be a band clamp, screws, bolts, cams or combinations thereof.

Figure 5:
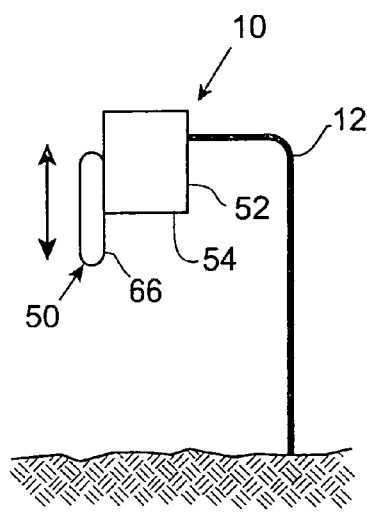
FIGS. 5 and 6 are diagrammatic views of other embodiments of the electric-field meter wherein the electric-field meter is provided with an adjustable rod or plate for mechanically adjusting the gain of the electric-field meter.
Figure 6:
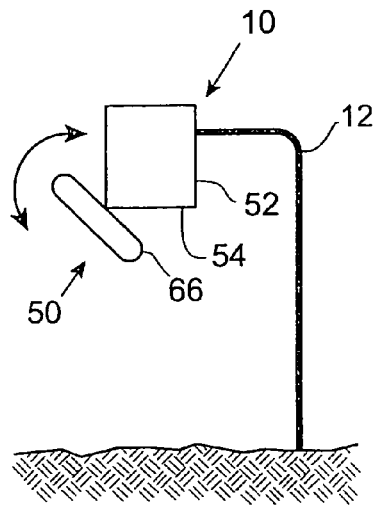
Figure 7:
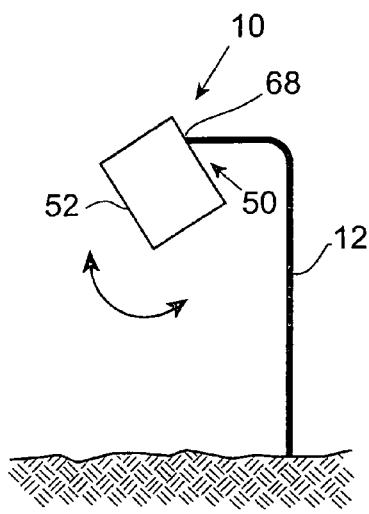
FIGS. 7 and 8 are diagrammatic views of other embodiments of the electric-field meter wherein the electric-field meter is adjustable relative to a mounting device for mechanically adjusting the gain of the electric-field meter.
Figure 8:
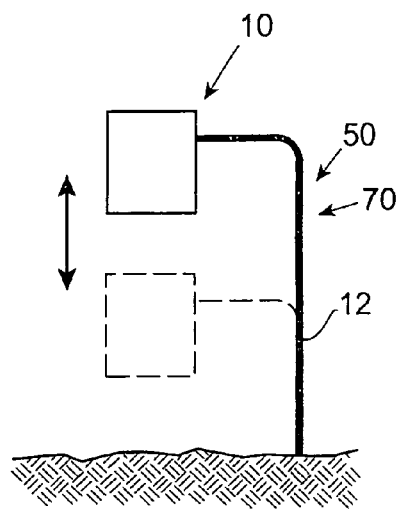

Although the mechanical gain adjustment assembly 50 has been shown and described herein as the shroud 60 and the securing mechanism 64, it should be understood that other manners of constructing the mechanical gain adjustment assembly 50 are contemplated. For example, the mechanical gain adjustment assembly 50 can be constructed of the following components either singularly or in combination: one or more selectively movable and securable conductive rods or conductive plates 66 positioned near the electrode assembly 26 as shown in FIGS. 5 and 6; an iris or shutter assembly having a plurality of movable vanes for changing the size of an aperture (not shown) providing access to the insulated electrode assemblies 26 and the shield assembly 28; a pivotal connection 68 between the electric-field meter 10 and the mounting device 12 for moving the electrode assembly 26 closer to a grounded, conducting object, such as a mounting mast or stanchion as shown in FIG. 7; or a sliding or telescoping mechanism 70 permitting adjustment of the height of the electric-field meter 10 relative to the ground as shown in FIG. 8.

Figure 9:
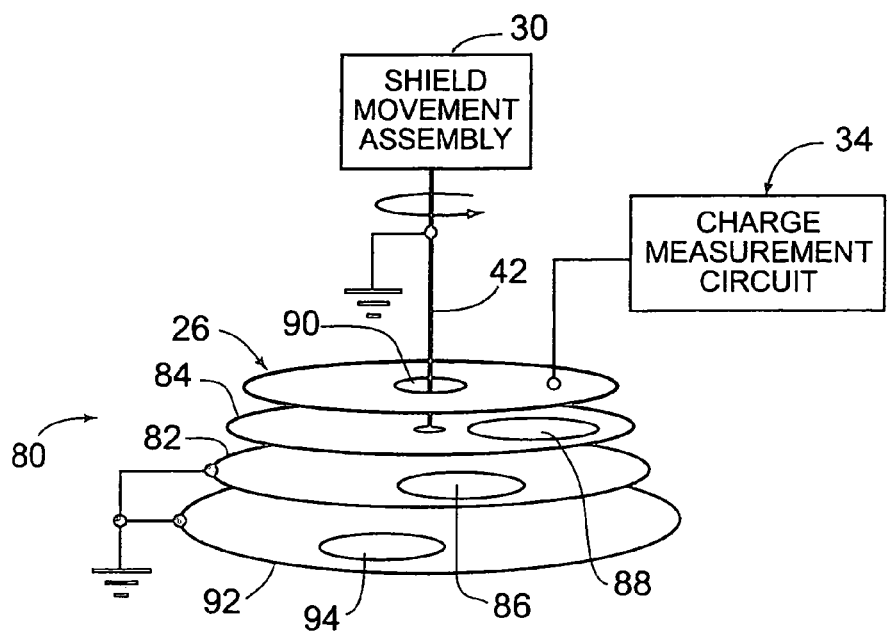
FIG. 9 is a perspective view of another embodiment of a mechanical gain adjustment assembly constructed in accordance with the present invention.

Referring now to FIG. 9, shown therein and designated by a reference numeral 80 is a second embodiment of a mechanical gain adjustment assembly constructed in accordance with the present invention. In general, the mechanical gain adjustment assembly 80 includes a fixed shield 82 which is spaced a distance away from the electrode assembly 26, and a movable shield 84. The fixed shield 82 is at least partially constructed of a conductive material and is connected to ground. The fixed shield 82 has one or more apertures 86 formed therethrough. The movable shield 84 has one or more apertures 88 formed therethrough. The movable shield 84 is movable through a predetermined path configured to overlap the aperture 88 in the movable shield 84 with the aperture 86 in fixed shield 82. By varying the amount of overlap between the apertures 88 and 86, the covering and uncovering of the electrode assembly 26 is effected.

In one preferred embodiment, the electrode assembly 26 is provided with an opening 90 formed therethrough. The linkage 42 extends through the opening 90 and supports the movable shield 84. The movement assembly 30 in this embodiment is preferably the stepper motor. In this instance, the movement assembly 30 is controlled by the microcontroller 36 to move the movable shield 84 either to the fully overlapped position, or to some position that only partially overlaps the apertures 86 and 88 in the fixed and movable shields 82 and 84. For example, if a stepper motor having small steps is used, e.g., 1.8 or 0.9 degrees per step, and if the stepper motor is controlled to half-step the stepper motor, very fine position changes can be made in the overlapping of the apertures 88 and 86. In other words, the stepper motor alternately moves the movable shield 84 to a closed or non-overlapped position, and then moves the movable shield 84 to the partially overlapped position so that the electric-field at the electrode assembly 26 is reduced by some predetermined fraction that is controlled automatically with every measurement cycle. When the movable shield 84 is moved to overlap the apertures 84 and 86 only partially, a reduction in effective aperture is achieved.

As shown in FIG. 9, the mechanical gain adjustment assembly 80 can optionally be provided with an adjustable shield 92. The adjustable shield 92 is constructed of a conductive material and is connected to the ground reference potential 42. The adjustable shield 92 has one or more apertures 94 formed therethrough. The adjustable shield 92 can be adjusted (manually or automated) such that the aperture 94 in the adjustable shield 92 overlaps the aperture 86 in the fixed shield 82, effecting the same purpose as the mechanical gain adjustment assembly 50. By varying the amount of overlap between the apertures 94 and 86, the effective aperture is also varied. In other words, the adjustable shield 92 can be moved and fixed to constrict or open the size of the aperture 86 in the fixed shield 82. In one preferred embodiment, the adjustable shield 92 and the fixed shield 82 can be formed of conductive material, such as cast metal, or sheet metal that move relative to one another.

The size and/or the shape of the apertures 86, 88 and 94 can be varied. The shape of the apertures 86, 88 and 94 can be any of a variety of geometric, non-geometric or fanciful shapes. The relative location of the movable shield 84, fixed shield 82 and adjustable shield 92 can be varied.

Although the mechanical gain adjustment assembly 80 has been described herein as having the movable shield 84, fixed shield 82 and the adjustable shield 92 with the apertures 86, 88 and 94, it should be understood that the mechanical gain adjustment assembly 80 should not be limited to the apertures 86, 88 and 94 unless such apertures 86, 88 and 94 are specifically recited in the appended claims. The function of the apertures 86, 88 and 94 is to vary the size of the effective aperture. For example, the mechanical gain adjustment assembly 80 can be implemented with the aperture 86 formed in the fixed shield 82 and the movable shield 84 formed of a vane or a blade movable to completely overlap or partially overlap the aperture 86.

Insulated Electrode Assemblies

Figure 10:
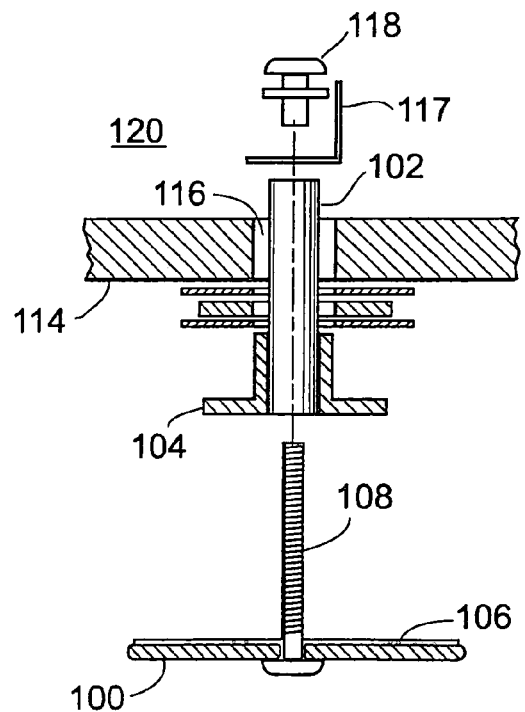
FIG. 10 is an exploded, side elevational view of an electrode assembly constructed in accordance with the present invention.
Figure 11:
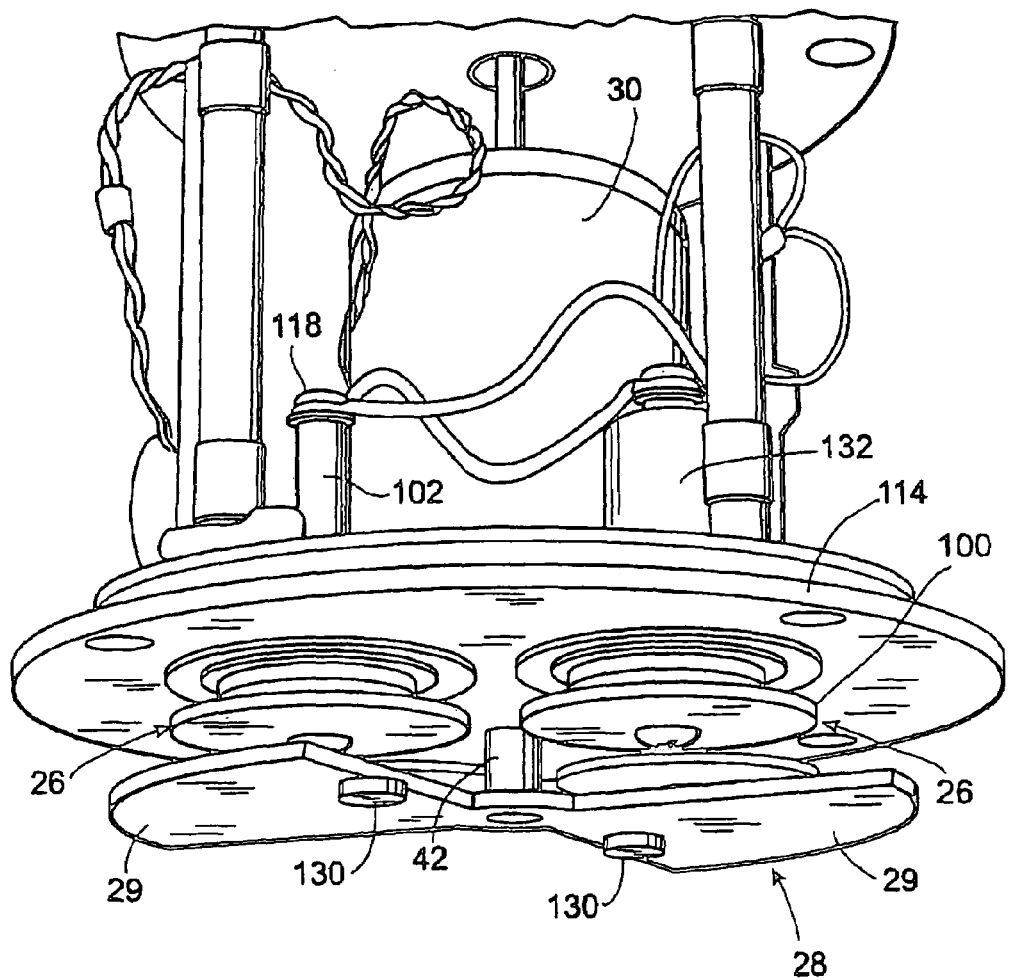
FIG. 11 is a perspective view of one embodiment of the electric-field meter having a housing removed.

Referring now to FIGS. 10 and 11, shown therein in greater detail is one version of the electrode assembly 26. The electrode assembly 26 is designed to permit easy cleaning and/or replacement of the insulators with minimal disassembly of the electric-field meter 10. As mentioned in the background section, it is necessary to clean the insulators periodically when the insulators become covered with films of dust, moisture and salt spray that after a time cause degradation of insulation.

The electrode assembly 26 is provided with a sensing electrode 100, a standoff 102, a fixed insulator 104, a replaceable insulator 106, and an electrode mount 108. The sensing electrode 100 is constructed of a conductive and preferably non-corrosive material, such as stainless steel or gold, or plated metal. The fixed insulator 104 is constructed of an insulating material, such as Teflon brand insulator, KEL F brand insulator, glass or wax. The standoff 102 is constructed of a conductive material, such as stainless steel or gold-plated metal. The fixed insulator 104 is connected to the standoff 102 such that the fixed insulator 104 extends beyond the periphery of the standoff 102. In one embodiment, the fixed insulator 104 is connected, e.g., press-fit, threaded, or epoxied, to the standoff 102.

The electrode mount 108 removably connects the sensing electrode 100 to the standoff 102. The sensing electrode 100 is electrically connected to the standoff 102. The electrode mount 108 can be a screw, a snap fastener, a friction mount or the like. Although FIG. 10 shows the electrode mount 108 and the sensing electrode 100 being two separate components which are connected together, it should be understood that the electrode mount 108 and the sensing electrode 100 can be of unitary construction. When the electrode mount 108 and the sensing electrode 100 are formed of separate components, the electrode mount 108 is desirably affixed to the sensing electrode 100 so as to provide a secure mechanical and electrical connection therebetween. The replaceable insulator 106 is positioned between the sensing electrode 100 and the fixed insulator 104. The replaceable insulator 106 can be Teflon brand insulator, KEL F brand insulator, glass or wax, for example.

To connect the electrode assembly 26 to the electric-field meter 10, the housing 52 of the electric-field meter 10 is provided with a mounting surface 114 having an electrode mounting opening 116. The standoff 102 and the fixed insulator 104 are disposed in the electrode mounting opening 116. Desirably, the fixed insulator 104 is received within the electrode mounting opening 116 so as to space the standoff 102 away from the mounting surface 114 thereby insulating the standoff 102 from the mounting surface 114 of the housing 52.

The electrode assembly 26 can be mounted to the mounting surface 114 with any suitable mechanical scheme or linkage. For example, a terminal 117 can be mounted to the standoff 102 via a screw 118. In this instance, the terminal 117 and the fixed insulator 104 are on opposing sides of the mounting surface 114. The terminal 117 also functions to provide an electrical connection between the electrode assembly 26 and the charge measurement circuit 34. Alternatively, the electrode assembly 26 can be mounted to the mounting surface 114 by threading the fixed insulator 104 and the electrode mounting opening 116, or using tabs, adhesive bonding, cohesive bonding, press fitting or the like to secure the fixed insulator 104 to the mounting surface 114.

Once the electrode assembly 26 is mounted to the mounting surface 114, the housing 52 defines a cavity 120 that is sealed. A desiccant pack (not shown) is loaded into the housing 52 before sealing of the cavity 120.

To clean or replace the sensing electrode 100, replaceable insulator 106, and the fixed insulator 104 of the electrode assembly 26, the electrode mount 108 is manipulated from outside of the housing 52 so as to remove the sensing electrode 100 and the replaceable insulator 106 from the standoff 102. For example, when the electrode mount is a screw, the screw can be removed with a screwdriver. Once the sensing electrode 100 and the replaceable insulator 106 are removed from the standoff 102, the electrode 100 and the replaceable insulator 106 can be cleaned, or replaced and the fixed insulator 104 can be cleaned. Thus, it will be understood by those skilled in the art that the sensing electrode 100 and the replaceable insulator 106 can be removed and/or cleaned with minimal disassembly of the electric-field meter 10. This permits replacement or cleaning of the sensing electrode 100 and the replaceable insulator 106 in the field by a relatively unskilled technician. This is a vast improvement over the prior art electric-field meters which required an extensive disassembly of the electric-field meter to clean and/or replace the electrodes and/or insulators.

Position Detection Assemblies

Figure 12:
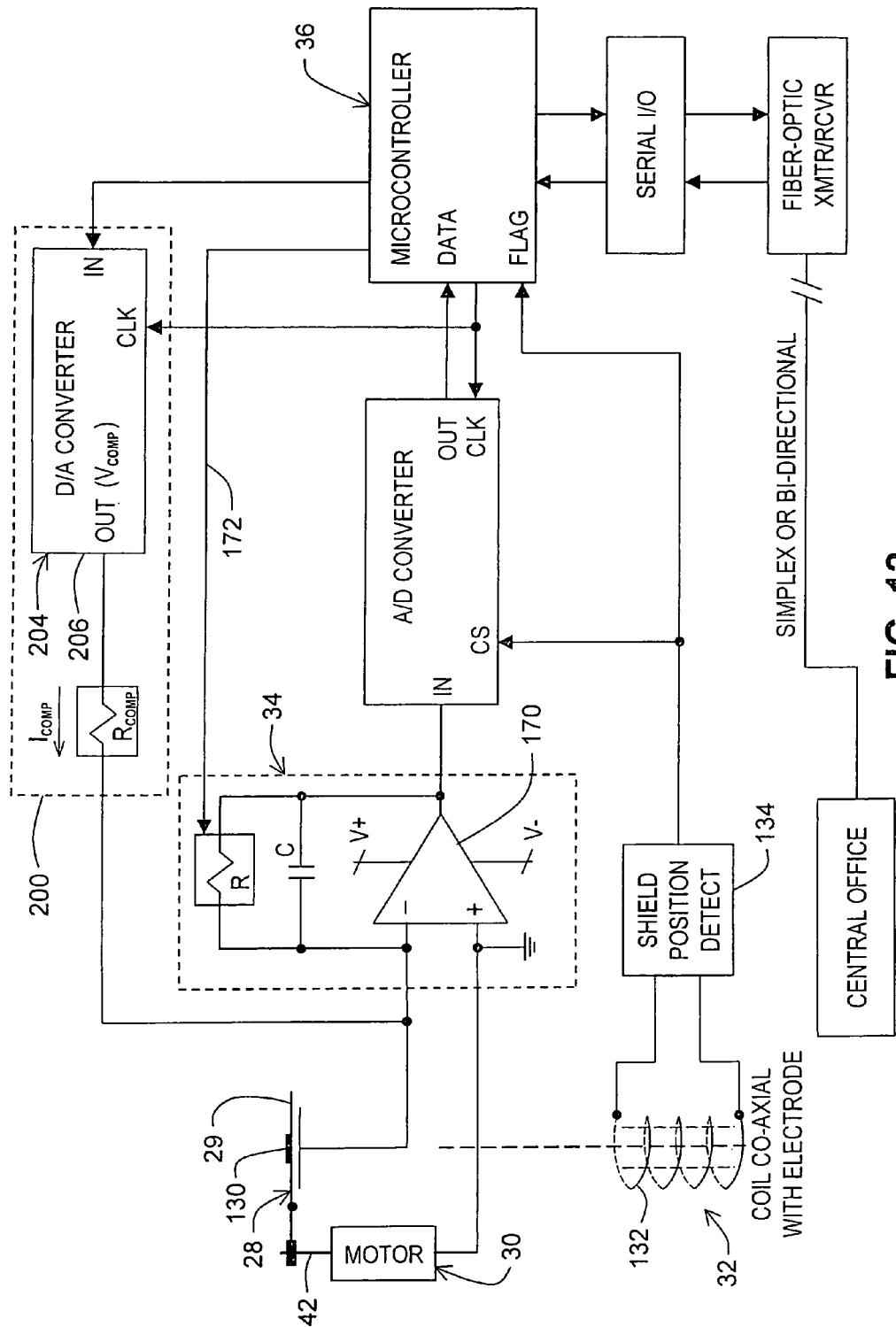
FIG. 12 is a schematic diagram of the electric-field meter depicted in FIG. 1 wherein a position detection assembly is shown in more detail.

Referring now to FIG. 12, shown therein in schematic or block diagram form is the position detection assembly 32. In every type of electro-static field measuring machine, the position of the moving conductor, e.g., the shield assembly 28 of a field mill, must be known in order to determine the polarity of the field being measured and to know the time at which the signal is at peak value. In the electric-field meter 10, when the movement assembly 30 is a stepper motor the position of the shield assembly 28 is known automatically and intrinsically as a result of the microcontroller 36 controlling the stepper motor as discussed above. However, even with the movement assembly 30 being the stepper motor, position errors such as missteps can occur. For this reason, the position of the shield assembly 28 is preferably detected directly by the position detection assembly 32, rather than by using additional components that must be referenced to the shield assembly 28 by subsequent mounting and adjustment.

In general, the position detection assembly 32 is provided with a first element 130 mounted onto one or more vane 29 of the shield assembly 28, a second element 132 (FIGS. 11 and 12) mounted in a known relationship to the predetermined path of the shield assembly 28, and a detect circuit 134 receiving an output from the first element 130 or the second element 132. The first element 130 is epoxied, soldered, riveted, bolted, spot welded, threaded, or otherwise mechanically attached to the shield assembly 28. The second element 132 is desirably mounted adjacent to the mounting surface 114 of the housing 52 such that the shield assembly 28 and the second element 132 are mounted on opposing sides of the mounting surface 114. However, it should be understood that the first and second elements 130 and 132 can be mounted on the same side of the mounting surface 114. The second element 132 detects the movement of the first element 130 when the first element 130 passes near the second element 132, and in response thereto outputs one or more signals in synchrony with the position of the shield assembly 28 over the electrode assembly 26. The detect circuit 134 receives the signals from the first element 130 or the second element 132 and in response thereto conditions such signals to be in a form recognizable by the microcontroller 36.

In a preferred embodiment shown in FIGS. 11 and 12, the first element 130 is a magnet, the second element 132 is a coil and the detect circuit 134 is a comparator. This embodiment requires only a low-power comparator to perform pulse detection and minimal low-power combinatorial logic as active components, therefore enabling synchronous shield assembly 28 detection at microwaft power levels with no adjustment or calibration required. The coil is desirably located in a co-axial relationship with the sensing electrode 100. Alternatively, the first or second elements 130 and 132 can include, for example, modulation of the self-inductance of a coil that is used as an element of an oscillator by sweeping a ferrous object near the coil, optical components and a light source, printing or etching to provide variations in reflected light to an appropriately mounted sensor, solid state magnetic field sensors such as Hall Effect devices, SQUIDS, etc. For example, a light source and light detector (first element 130) can be attached to the vane 29 of the shield assembly 28, and a retroreflector (second element 132) can be attached to the mounting surface 114. Alternatively, the retroreflector (first element 132) can be attached to the vane 29 of the shield assembly 28, and the light source and light detector (second element) can be attached to the mounting surface 114.

Electrical Contact Assembly

In accordance with the present invention, the electric-field meter 10 is provided with an electrical contact assembly 140 (FIGS. 13 and 14) for grounding or receiving a signal from a moving electrode assembly 26, or the shield assembly 28. In one preferred embodiment, the electrical contact assembly 140 engages a moving conductor 142, which is typically the linkage 42 of the movement assembly 30. For example, when the electric-field meter 10 is configured as a field mill, the electrical contact assembly 140 grounds the shield assembly 28, whereas when the electric-field meter 10 is configured as an agrimeter, the electrical contact assembly 140 receives a signal from the electrode assembly 26c.

Figure 13:
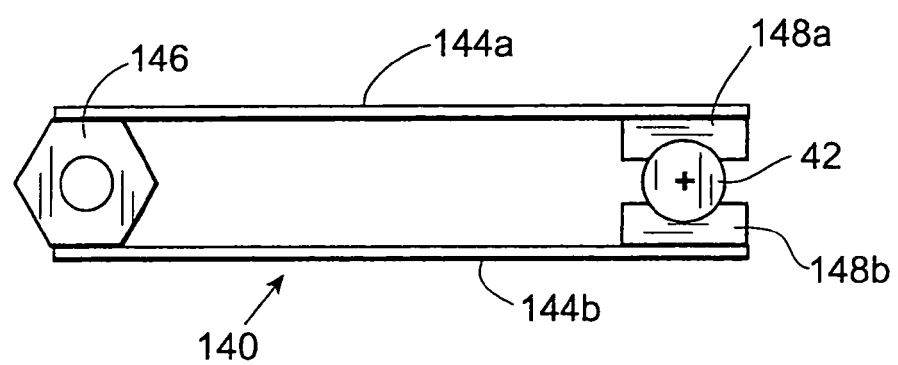
FIG. 13 is a top plan view of an electrical contact assembly constructed in accordance with the present invention.
Figure 14:
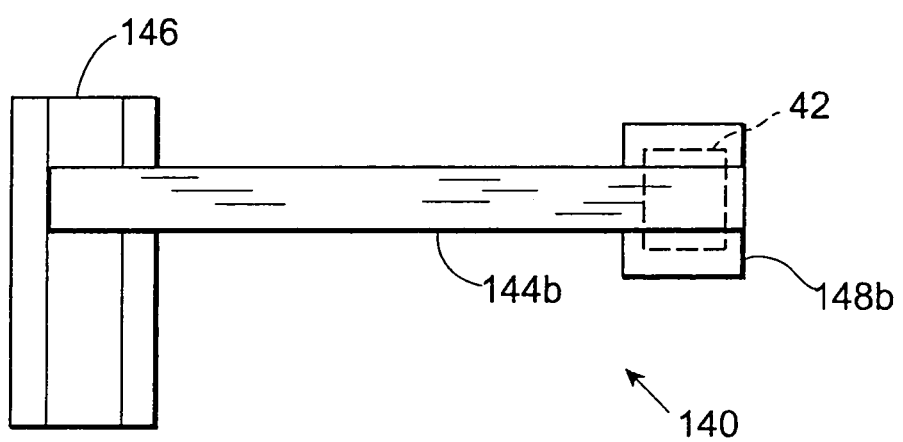
FIG. 14 is a side elevational view of the electrical contact assembly depicted in FIG. 13.

Shown in FIG. 13 is an embodiment of the electrical contact assembly 140 for use in applications where the movement assembly 30 moves the shield assembly 28 a in rotating, reciprocating or oscillating fashion. The electrical contact assembly 140 engages the linkage 42 of the movement assembly 30 and thereby provides electrical contact therebetween. The electrical contact assembly 140 is provided with a pair of conducting members 144a and 144b. The conducting members 144a and 144b are spaced a distance apart. The conducting members 144a and 144b are electrically connected to and supported by a standoff 146. The standoff 146 is connected to the mounting surface 114 of the electric-field meter 10, or frame of the electric-field meter 10 to provide support for the conducting members 144a and 144b. Each of the conducting members 144a and 144b supports a pad 148a and 148b, respectively, engaging the sides or an end of the linkage 42. The pads 148a and 148b can be constructed of a conductive cloth material, such as carbonized cloth, graphite cloth, metal cloth or the like.

To provide low friction, low noise, electrical contact between the conducting members 144a and 144b and the linkage 42, each of the pads 148a and 148b is loaded with a conductive lubricant, such as Nyogel 753G obtainable from Nye, other conductive particles, or oils or greases loaded with conductive particles. The conducting members 144a and 144b can be connected to the ground reference potential 40 to ground the linkage 42. Alternatively, the conducting members 144a and 144b can be electrically connected to the charge measurement circuit 34 so that the charge measurement circuit 34 receives a signal from a moving electrode.

Figure 15:
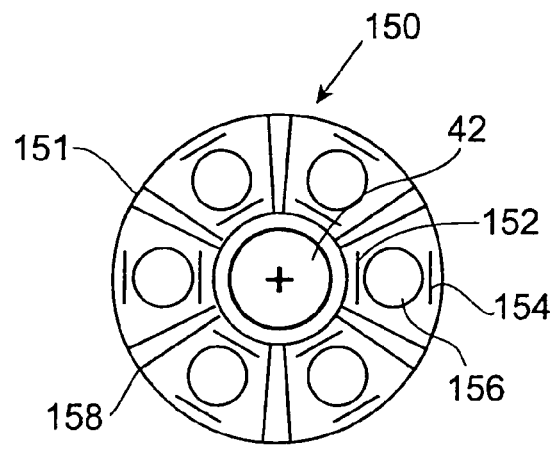
FIG. 15 is a fragmental view of a second version of an electrical contact assembly constructed in accordance with the present invention.

Shown in FIG. 15 and designated by a reference numeral is another example of an electrical contact assembly 150 constructed in accordance with the present invention for use in applications where the movement assembly 30 moves the shield assembly 28 in a rotating, reciprocating or oscillating fashion. The electrical contact assembly 150 is provided with a sealed antifriction bearing 151 having an inner surface 152 , an outer surface 154, one or more rolling element(s) 156, and a cage 158 for retaining the rolling element(s) 156 in position. The surfaces 152 and 154 are typically designed to reduce (as far as possible) all friction. However, the surfaces 152 and 154 could be formed on a bushing. The cage 158 retains the rolling element(s) 156 in a spaced apart position between the inner surface 152 and the outer surface 154. The rolling elements 156a can be spherical balls, or rollers. The rollers can be provided with any suitable shape, such as cylindrical, tapered, barrel-shaped, needle-shaped or the like.

The outer surface 154 and the inner surface 152 are constructed of conductive material(s), such as stainless steel, aluminum or brass. The outer surface 154 is typically supported by the mounting surface 114, frame or other bodies of metal in the electric-field meter 10. When it is desired to ground the shield assembly 28, the mounting surface 114, frame or other bodies of metal in the electric-field meter 10 can be connected to ground, e.g., in a field mill.

When it is desired to receive a signal from a moving electrode (e.g., an agrimeter), a connector can be connected to the mounting surface 114, frame or other bodies of metal in the electric-field meter 10 for receiving the signal. The inner surface 152 engages the linkage 42.

The rolling elements 156 are spaced a distance apart to form at least one void therebetween. To lubricate the rolling elements 156a as well as increase the conductivity between the outer surface 154 and the inner surface 152, the anti-friction bearing includes conductive lubricant positioned about the rolling elements 156a and within the void. The conductive lubricant can be Nyogel 753G obtainable from Nye or any of a variety of grease-like or lubricating substances that are loaded with conductive particles. The conductive lubricant is sealed within the void of the anti-friction bearing 151 by any suitable sealing device, such as grease grooves in the bore of the housing, felt washers, leather or synthetic-rubber seals, labyrinth washers or the like.

The construction and use of bearings is well known in the art. Thus, no further comments are deemed necessary to teach one skilled in the art to make and use the electrical contact assembly 150 of the present invention.

Figure 16:
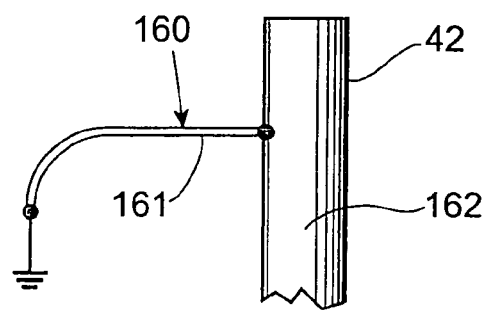
FIG. 16 is a side elevational view of a third version of an electrical contact assembly constructed in accordance with the present invention.
Figure 17:
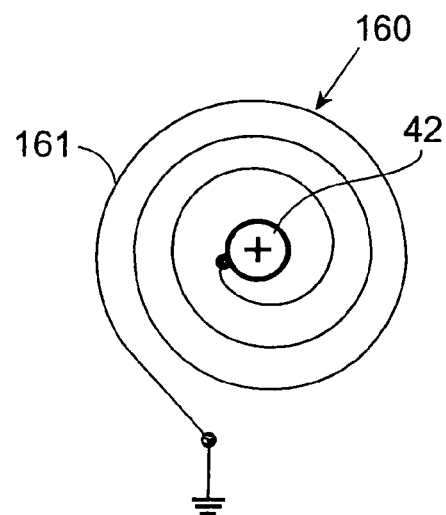
FIG. 17 is a top plan view of a fourth version of an electrical contact assembly constructed in accordance with the present invention.

Shown in FIGS. 16 and 17 are two other examples of an electrical contact assembly 160 constructed in accordance with the present invention for use in applications where the movement assembly 30 moves the shield assembly 28 or the electrode assembly 26 in the reciprocating or oscillating manner. The electrical contact assembly 160 includes a flexible conductor 161 bonded to the linkage 42 and bonded either to the ground reference potential 40 or the charge measurement circuit 34. This completely obviates the need for any sort of wiping or probing contact and therefore eliminates the limitations imposed by such means. The flexible conductor 161 is arranged to have sufficient freedom of movement so that it can perform a large number, such as billions of cycles without breaking or losing contact. The flexible conductor 161 can be bonded to an end or side 162 of the linkage 42 in various manners. For example, the flexible conductor 161 can be clamped, crimped, screwed, soldered, or welded to the linkage 42. The flexible conductor 161 can be implemented as a solid wire (as shown in FIG. 16), a stranded wire, a coiled metal spring (as shown in FIG. 17), a flexible sheet metal strip or the like.

One of the electrical contact assemblies 140, 150 or 160 can be used for grounding the shield assembly 28 or receiving a signal from a moving electrode, or more than one of the rotor contact assemblies 140, 150 or 160 can be used to provide redundancy and thereby increase the reliability of the electric-field meters 10, 10a, 10b and 10c. Alternatively, combinations of the electrical contact assemblies 140, 150 and 160 can be used to provide redundancy.

Error Detection and Correction

As discussed above in the Background section, prior-art field meters suffer from two types of uncorrected errors that change with time, temperature, humidity and atmospheric pollutants. Typical instruments that predate the present invention have a zero-signal output (defined as the output value of the field meter with an imposed electric field of zero) that is typically set during manufacture but which subsequently changes in an unknown way with use and time. Because valuable information about atmospheric electrical conditions can be obtained around zero and at the zero-crossing, i.e., when the electric field reverses polarity, there is a significant advantage in having a zero-signal reading that is known with confidence throughout the operating life of the instrument.

Prior-art field meters also suffer from variations in leakage current at the charge-amplifier input due to conduction across insulators associated with the sense electrode and the circuitry used for charge measurement. For prior-art field meters at the place and time of manufacture, the average leakage current at the charge-amplifier input is typically negligible but can change in magnitude and/or polaritydepending upon insulator cleanliness, and offset voltage of the charge amplifier. The average leakage current in prior-art field meters is an unknown variable that can degrade an instrument to a state of improper operation without warning. Uncorrected changes in average leakage currents tend to cause errors in the measured electric field which can lead to improper assessment of atmospheric electrical threats.

Field meters that suffer from unknown and uncorrected zero-signal offset errors and average leakage currents at the charge amplifier input do not always provide information of high quality over long periods of use and such field meters typically require labor intensive testing, adjusting and cleaning at times that have to be determined empirically. Here we teach methods for making field meters that measure and correct zero-signal offset errors and errors due to leakage current at the charge-amplifier input of the charge measurement circuit 34 automatically and continuously so as to enhance the quality of the measurements made. The zero-signal offset errors can be determined during each measurement cycle, or as frequently as desired. For example, the zero-signal offset errors can be determined during every measurement cycle, every third measurement cycle, or every tenth measurement cycle.

Field meters of the present invention can also be preset, at the factory or by the user, to warn in some way of increases in the average leakage current at the charge-amplifier input of the charge measurement circuit 34 allowing the instrument to inform users when maintenance, e.g., insulator cleaning or replacement, is required, rather than relying on scheduled maintenance or waiting for malfunction. These error detecting, correcting and monitoring features can be used automatically or manually to prevent use of degraded measurements.

Specific features of the present invention permit these novel error detection and correction capabilities when combined with measurement steps taken in sequence by the microcontroller 36. Zero-signal output is tested at least twice per measurement cycle when the shield assembly 28 is in the position that completely covers the sense electrode of the electrode assembly 26. As shown in FIG. 12, the charge measurement circuit 34 includes a charge-amplifier, i.e., an operational amplifier 170 configured as a charge-to-voltage transducer, with a capacitor C as the gain determining element and a selectable resistance R across the capacitor C that sets the decay rate of charge on the capacitor, allows optimum setting of circuit parameters for error detection purposes and normal measurements.

The selectable resistance R can be a low value, e.g., the on-resistance of a relay, to quickly reset the charge amplifier, an intermediate value to provide a fixed decay rate throughout the measurement, or be removed from the circuit to provide the longest time constant possible for the charge amplifier circuit. Mechanical switches or relays can be employed to implement the selectable resistance R. Alternatively, the selectable resistance R may be implemented with switchable, fixed resistors, a motor-driven variable resistor, or a solid-state voltage-controlled resistor such as a field-effect transistor. These various methods of implementing a selectable resistance are well known in the art. The resistance value of the selectable resistance R is selected by the micro-controller 26 via a signal path 172.

The error detecting, correcting and monitoring features of the present invention may be implemented with field meters 10, 10a, 10b and 10c of all types including field meters 10, 10a, 10b and 10c that use rotary, reciprocating or oscillating motion of one conducting element relative to another conducting element, providing that proper considerations for motion control, moving conductor (i.e., shield assembly 28 or electrode assembly 26) position detection, etc., are taken into account.

The steps taken by the microcontroller 36 to measure and correct for zero-signal offset error are:

a. Position the movable shield assembly 26 (or the electrode assembly 26) so that the sense electrode 100 is completely shielded from the external electric field.
b. Select a resistance across the capacitor C in the charge-amplifier that gives a short decay-time typically less than 5 milliseconds of the RC circuit in the charge-amplifier.
c. Select a resistance across the capacitor C in the charge-amplifier that gives a long decay-time typically at least 1 second of the RC circuit in the charge-amplifier.
d. Allow for settling time and digitize the zero-signal offset error (hereafter referred to as Verror) and store the measurement.
e. Position the movable shield assembly 26 to selectively expose the sense electrode to the external electric field.
f. Digitize the charge-amplifier output (hereafter referred to as Vsig).
g. Compare the previously stored zero-signal offset error and the normal measurement using mathematical operations in such a way that the zero-signal offset error contribution to the overall measurement is removed. For example, subtraction can be used (Vsig-Verror) to remove the zero-signal error.
h. Store and/or communicate the corrected measurement of electric field to the outside world.

The steps above for determining the zero-signal offset error and correcting for the zero-signal offset error can be taken at any desired rate including but not limited to one or more times per measurement cycle or at any desired rate. Moreover, the correction for the zero-signal offset error can be accomplished locally or at a remote site.

The steps taken to measure and correct for the average leakage current at the charge-amplifier input of the charge measurement circuit 34 are:

a. Position the movable shield assembly 26 (or the electrode assembly 26) so that the sense electrode 100 is completely shielded from the external electric field.
b. Select a resistance across the capacitor C in the charge-amplifier that gives a short decay-time typically less than 5 milliseconds of the RC circuit in the charge-amplifier.
c. Select a resistance across the capacitor C in the charge-amplifier that gives a long decay-time typically at least 1 second of the RC circuit in the charge-amplifier.
d. Allow for settling time and digitize the zero-signal offset error (hereafter referred to as Voffset1) and store the measurement.
e. Wait a sufficient time (eg. 10 ms) for a non-negligible leakage current to cause a change in the zero-signal offset error.
f. Position movable shield assembly 26 so that the sense electrode 100 is again completely shielded from the external electric field.
g. Allow for settling time and digitize the zero-signal offset error (hereafter referred to as Voffset2) and store the measurement.
h. Compare Voffset1 and Voffset2 in such a way that the average leakage current is determined. For example, the average leakage current is equal to C * (Voffset2-Voffset1)/(Toffset2-Toffset1).
i. Store and/or communicate the average leakage current associated with the measurement of the electric field to the outside world.
j. Utilize the new, measured average leakage current for compensation of the following measurement.

The steps above can be taken at any desired rate including but not limited to one or more times per measurement cycle. Moreover, the correction for the average leakage current can be accomplished locally by the microcontroller 36, for example, or at a remote site. In the instance where the correction for the average leakage current and/or the zero-signal offset error is accomplished at the remote site, all measured and stored information would be output to the remote site by the field meter 10. Furthermore, although the algorithms or steps taken for calculating the average leakage current and the zero-signal offset error are discussed above separately, it should be understood that in practice these steps could be combined into a single algorithm.

The selectable resistor R can be replaced with a fixed resistor having a high value to provide the RC circuit with a long-time constant, such as greater than 1 second. In this instance, one must wait until the capacitor is discharged before determining the zero-signal offset error.

As discussed above, the steps taken to measure and correct for the average leakage current at the charge-amplifier input of the charge measurement circuit 34 includes making two zero signal offset measurements separated sufficiently in time. The average leakage current is then determined from the average rate-of-change of the zero signal offset of the charge amplifier. Differences between these zero signal values are primarily due to the leakage current on the charge-amplifier input of the charge measurement circuit 34. As such, increasing leakage currents can result in increasing differences between the zero signal values and eventually result in measurement over-range. To significantly extend the useful range of leakage currents in which the steps taken to measure and correct for the average leakage current at the charge-amplifier input of the charge measurement circuit 34 can function optimally, the charge measurement circuit 34 can further include a leakage current compensation circuit 200, such as shown for example in FIG. 12.

In general, the current compensation circuit 200 automatically and continuously (i.e., in real-time) generates a compensation current generally equal to and opposite in polarity to the unwanted leakage current on the charge-amplifier input of the charge measurement circuit 34. In one preferred embodiment, the compensation current is based on the measured average leakage current utilized in the steps taken by the microcontroller 36 to measure and correct for the average leakage current at the charge-amplifier input of the charge measurement circuit 34 (discussed above).

As shown in FIG. 12, in one embodiment, the leakage current compensation circuit 200 includes a compensation voltage source 204 which generates a programmable compensation output (hereafter referred to as Vcomp). The Vcomp is connected to the charge-amplifier input by a large value resistance Rcomp, in which the desired compensation current (hereafter referred to as Icomp) is developed. In one preferred embodiment, the compensation voltage source 204 is a digital-to-analog converter 206 controlled by the microcontroller 36. Further, the range and resolution of the leakage current compensation circuit 200 can be adjusted by varying the Vcomp voltage (e.g. via the D/A convertor 206 and microcontroller 36) and/or the magnitude of the resistance of Rcomp (e.g. via a variable or selectable resistor).

Any method that can generate a known average current can be used to generate a leakage current compensation. For example, a multiplexer multiplexing four voltages across a resistor could be used.

Changes may be made in the construction and operation of the various components, elements and assemblies described herein and changes may be made in the steps or the sequence of steps of the methods described herein without departing from the spirit and the scope of the invention as defined in the following claims.

What is claimed is:

1. An electric-field meter for measuring at least one of a magnitude and polarity of an electric field, comprising:
    a housing at least partially constructed of a conductive material, the housing defining a retaining space;
    an electrode assembly maintained in a stationary position on the housing and selectively exposed to the electric field;
    a shield assembly maintained at the ground reference potential and movable with respect to the electrode assembly through a predetermined path for alternately covering and exposing the electrode assembly to the electric field;
    a movement assembly having a source of motive force and a linkage operably connected to the shield assembly for moving the shield assembly with respect to the electrode assembly for alternately covering and exposing the electrode assembly to the electric field;
    a position detection assembly for monitoring the position of at least a portion of the shield assembly and providing a shield position detection signal indicative of the position of the shield assembly;
    a charge measurement circuit receiving charge on the electrode assembly, the charge measurement circuit providing a charge detection signal indicative of the charge induced on the electrode assembly as the electrode assembly is selectively exposed to the electric field; and
    means for mechanically adjusting an effective aperture to vary the exposure of the electrode assembly to the electric field.

2. The electric-field meter of claim 1, wherein the means for mechanically adjusting the effective aperture includes a shroud positioned on the housing, the shroud defining an aperture that permits the electric field to act on the electrode assembly, the shroud being movable on the housing and fixable at a desired position to set the effective aperture.

3. The electric-field meter of claim 1, wherein the means for mechanically adjusting the effective aperture includes:
    a fixed shield spaced a distance from the electrode assembly, the fixed shield at least partially constructed of a conductive material and maintained at the ground reference potential, the fixed shield having at least one aperture formed therethrough, and wherein the shield assembly is movable to partially overlap the aperture in the fixed shield a predetermined amount, the amount of partial overlap being adjustable to vary the effective aperture.

4. The electric-field meter of claim 3, wherein the source of motive force of the movement assembly further comprises at least one of a DC servo motor and a stepper motor that moves alternately the shield assembly from a closed or non-overlapped position,to the partially overlapped position so that some predetermined fraction of flux of the electric field through the aperture of the fixed shield is provided to the electrode assembly.

5. The electric-field meter of claim 3, wherein the means for mechanically adjusting the effective aperture includes an adjustable shield constructed of a conductive material and connected to the ground reference potential, the adjustable shield having at least one aperture at least partially overlapping the aperture in the fixed shield, the amount of partial overlap between the aperture in the adjustable shield and the fixed shield being adjustable to vary the effective aperture and fixable at a desired position.

6. The electric-field meter of claim 1, wherein the housing comprises a mounting surface defining an electrode mounting opening therethrough, and wherein the electrode assembly comprises:
    an electrode constructed of an electrically conductive material, the electrode being spaced a distance from the mounting surface and supported by the mounting surface, the electrode being removable from the mounting surface from the outside of the housing.

7. The electric-field meter of claim 6, wherein the electrode assembly further comprises:
    an insulator disposed adjacent to the electrode mounting opening formed through the mounting surface, the insulator constructed of a dielectric material and positioned between the electrode and the mounting surface; and
    a standoff electrically connected to the electrode and electrically connected to the charge measurement circuit.

8. The electric-field meter of claim 7, wherein the electrode assembly further comprises an electrode mount removably connecting the electrode to the standoff.

9. The electric-field meter of claim 7, wherein the electrode assembly further comprises an electrode mount removably connecting the electrode to the standoff.

10. The electric-field meter of claim 9, wherein the electrode assembly further comprises a terminal electrically connected to the standoff, and wherein the electrode and the terminal are positioned on opposite sides of the mounting surface.

11. The electric-field meter of claim 9, wherein the electrode assembly further comprises a terminal electrically connected to the standoff, and wherein the electrode and the terminal are positioned on opposite sides of the mounting surface.

12. The electric-field meter of claim 1, wherein the shield assembly moves in only one direction.

13. The electric-field meter of claim 12, further comprising an electrical contact assembly for maintaining continuity between the ground reference potential and the shield assembly while the shield assembly moves.

14. The electric-field meter of claim 13, wherein the electrical contact assembly comprises:
    an anti-friction bearing having an inner surface constructed of an electrically conductive material, and an outer surface constructed of an electrically conductive material, at least one of the outer surface and the inner surface engaging the linkage of the movement assembly and wherein the anti-friction bearing further comprises an amount of conductive lubricant disposed on at least one of the inner surface and the outer surface such that the conductive lubricant provides simultaneous contact between the linkage and the at least one of the inner surface and the outer surface.

15. The electric-field meter of claim 13, wherein the electrical contact assembly comprises:
    a pad constructed of a conductive cloth material, the pad being electrically connected to the ground reference potential and engaging the linkage of the movement assembly, the pad having conductive lubricant thereon so as to provide electrical interconnection between the linkage and the ground reference potential.

16. The electric-field meter of claim 12, wherein the position detection assembly comprises:
a first element mounted on the shield assembly; and
a second element mounted in a known relationship to the predetermined path of the shield assembly such that upon sweeping the shield assembly near the second element, the second element interacting with the first element when the first element passes near the second element, at least one of the first and second elements providing signals indicative of the position of the shield assembly; and
a detect circuit receiving signals from one of the first element and the second element, the detect circuit output being indicative of the position of the shield assembly.

17. The electric-field meter of claim 16, wherein the position detection assembly comprises a micro-controller receiving the signals that are indicative of the position of the shield assembly and monitoring the position of the shield assembly.

18. The electric-field meter of claim 17, wherein the source of motive force of the movement assembly includes at least one of a stepper motor and a DC-servo motor.

19. The electric-field meter of claim 1, wherein the shield assembly is moved in at least one of a reciprocating manner and an oscillating manner.

20. The electric-field meter of claim 19, further comprising a flexible conductor bonded to the linkage of the movement assembly for maintaining electrical contact between the ground reference potential and the shield assembly while the shield assembly is moved.

21. The electric-field meter of claim 1, wherein the shield assembly is stationary to expose at least a portion of the electrode assembly for a predetermined time period whereby the electric-field meter functions as an electric-field-change meter during the predetermined time period.

22. An electric-field meter for measuring a steady or changing electric field, comprising:
a housing at least partially constructed of a conductive material, the housing defining a retaining space;
an electrode assembly on the housing and selectively exposed to the electric field, the electrode assembly movable through a predetermined path;
a shield assembly maintained at the ground reference potential, the shield assembly maintained in a stationary position adjacent the predetermined path of the electrode assembly so as to alternately cover and expose the electrode assembly to the electric field when the electrode assembly moves relative to the shield assembly;
a movement assembly having a source of motive force and a linkage operably connected to the electrode assembly for moving the electrode assembly with respect to the shield assembly for alternately covering and exposing the electrode assembly to the electric field;
a position detection assembly for monitoring the position of at least a portion of the electrode assembly and providing a position detection signal indicative of the position of the electrode assembly;
a charge measurement circuit receiving charge on the electrode assembly, the charge measurement circuit providing a charge detection signal indicative of the charge induced on the electrode assembly as the electrode assembly is selectively exposed to the electric field; and
means for mechanically adjusting an effective aperture to vary the exposure of the electrode assembly to the electric field.

23. The electric-field meter of claim 22, wherein the means for mechanically adjusting the effective aperture includes a shroud positioned on the housing, the shroud defining an aperture that permits the electric field to act on the electrode assembly, the shroud being movable on the housing and fixable at a desired position to set the effective aperture.

24. The electric-field meter of claim 22, wherein the means for mechanically adjusting the effective aperture includes:
a fixed shield spaced a distance from the electrode assembly, the fixed shield at least partially constructed of a conductive material and maintained at the ground reference potential, the fixed shield having at least one aperture formed therethrough, and wherein the electrode assembly is movable to partially overlap the aperture in the fixed shield a predetermined amount, the amount of partial overlap being adjustable to vary the effective aperture.

25. The electric-field meter of claim 24, wherein the source of motive force of the movement assembly further comprises at least one of a DC servo motor and a stepper motor that moves alternately the electrode assembly from a closed or non-overlapped position to the partially overlapped position so that some predetermined fraction of flux of the electric field through the aperture of the fixed shield is provided to the electrode assembly.

26. The electric-field meter of claim 24, wherein the means for mechanically adjusting the effective aperture includes an adjustable shield constructed of a conductive material and connected to the ground reference potential, the adjustable shield having at least one aperture at least partially overlapping the aperture in the fixed shield, the amount of partial overlap between the aperture in the adjustable shield and the fixed shield being adjustable to vary the effective aperture and fixable at a desired position.

27. The electric-field meter of claim 22, wherein the housing comprises a mounting surface defining an electrode mounting opening therethrough, and wherein the electrode assembly comprises:
an electrode constructed of an electrically conductive material, the electrode being spaced a distance from the mounting surface and supported by the mounting surface, the electrode being removable from the mounting surface from the outside of the housing.

28. The electric-field meter of claim 27, wherein the electrode assembly further comprises:
an insulator disposed adjacent to the electrode mounting opening formed through the mounting surface, the insulator constructed of a dielectric material and positioned between the electrode and the mounting surface; and
a standoff electrically connected to the electrode and electrically connected to the charge measurement circuit.

29. The electric-field meter of claim 22, wherein the electrode assembly moves in only one direction.

30. The electric-field meter of claim 29, further comprising an electrical contact assembly for maintaining continuity between the ground reference potential and the electrode assembly while the electrode assembly moves.

31. The electric-field meter of claim 30, wherein the electrical contact assembly comprises:
a pad constructed of a conductive cloth material, the pad being electrically connected to the ground reference potential and engaging the linkage of the movement assembly, the pad having conductive lubricant thereon.

32. The electric-field meter of claim 30, wherein the electrical contact assembly comprises:
an anti-friction bearing having an inner surface constructed of an electrically conductive material, and an outer surface constructed of an electrically conductive material, at least one of the outer surface and the inner surface engaging the linkage of the movement assembly and wherein the anti-friction bearing further comprises an amount of conductive lubricant disposed on at least one of the inner surface and the outer surface such that the conductive lubricant provides simultaneous contact between the linkage and the at least one of the inner surface and the outer surface.

33. The electric-field meter of claim 29, wherein the position detection assembly comprises:
a first element mounted on the electrode assembly; and
a second element mounted in a known relationship to the predetermined path of the electrode assembly such that upon sweeping the shield assembly near the second element, the second element interacts with the first element, at least one of the first and second elements providing signals indicative of the position of the electrode assembly; and
a detect circuit receiving signals from one of the first element and the second element, the detect circuit output being indicative of the position of the electrode assembly.

34. The electric-field meter of claim 33, wherein the position detection assembly comprises a micro-controller receiving the signals that are indicative of the position of the electrode assembly and monitoring the position of the electrode assembly.

35. The electric-field meter of claim 34, wherein the source of motive force of the movement assembly includes at least one of a stepper motor and a DC-servo motor.

36. The electric-field meter of claim 22, wherein the electrode assembly is moved in at least one of a reciprocating manner and an oscillating manner.

37. The electric-field meter of claim 36, further comprising a flexible conductor bonded to the linkage of the movement assembly.

38. The electric-field meter of claim 22, wherein the electrode assembly is stationary to expose at least a portion of the electrode assembly for a predetermined time period whereby the electric-field meter functions as an electric-field-change meter during the predetermined time period.

39. An electric-field meter for measuring at least one of a magnitude and polarity of an electric field, comprising:
a housing at least partially constructed of a conductive material, the housing defining a retaining space;
an electrode assembly on the housing and selectively exposed to the electric field;
a shield assembly for alternately covering and exposing the electrode assembly to the electric field;
a movement assembly having a source of motive force and a linkage operably connected to one of the shield assembly and the electrode assembly for alternately covering and exposing the electrode assembly to the electric field;
a position detection assembly for monitoring the position of at least one of the shield assembly and the electrode assembly and providing a position detection signal indicative of the position of one of the shield assembly and the electrode assembly;
a charge measurement circuit receiving charge on the electrode assembly, the charge measurement circuit providing a chargedetection signal indicative of the charge induced on the electrode assembly as the electrode assembly is selectively exposed to the electric field; and
means for automatically and continuously determining a zero-signal offset error; and
means for mechanically adjusting an effective aperture to vary the exposure of the electrode assembly to the electric field.

40. The electric-field meter of claim 39, further comprising means for automatically and continuously correcting for the zero-signal offset error.

41. The electric-field meter of claim 40, further comprising means for mechanically adjusting an effective aperture to vary the exposure of the electrode assembly to the electric field.

42. An electric-field meter for measuring at least one of a magnitude and polarity of an electric field, comprising:
a housing at least partially constructed of a conductive material, the housing defining a retaining space;
an electrode assembly on the housing and selectively exposed to the electric field;
a shield assembly for alternately covering and exposing the electrode assembly to the electric field;
a movement assembly having a source of motive force and a linkage operably connected to one of the shield assembly and the electrode assembly for alternately covering and exposing the electrode assembly to the electric field;
a position detection assembly for monitoring the position of at least one of the shield assembly and the electrode assembly and providing a position detection signal indicative of the position of one of the shield assembly and the electrode assembly;
a charge measurement circuit having an input receiving charge on the electrode assembly, the charge measurement circuit providing a charge detection signal indicative of the charge induced on the electrode assembly as the electrode assembly is selectively exposed to the electric field; and
means for automatically and continuously determining an average leakage current at the input of the charge measurement circuit; and
means for mechanically adjusting an effective aperture to vary the exposure of the electrode assembly to the electric field.

43. The electric-field meter of claim 42, further comprising means for automatically and continuously determining a zero-signal offset error.

44. The electric-field meter of claim 42, further comprising means for automatically and continuously correcting for the average leakage current at the input of the charge measurement circuit.

45. The electric-field meter of claim 44, further comprising means for automatically and continuously determining and correcting for a zero-signal offset error.

46. An electric-field meter for measuring at least one of a magnitude and polarity of an electric field, comprising:
a housing at least partially constructed of a conductive material, the housing defining a retaining space;
an electrode assembly on the housing and selectively exposed to the electric field;

a shield assembly for alternately covering and exposing the electrode assembly to the electric field;

a movement assembly having a source of motive force and a linkage operably connected to one of the shield assembly and the electrode assembly for alternately covering and exposing the electrode assembly to the electric field, the movement assembly being stationary and exposing at least a portion of the electrode assembly for a predetermined time period whereby the electric-field meter functions as an electric-field-change meter during the predetermined time period;

a charge measurement circuit receiving charge on the electrode assembly, the charge measurement circuit providing a charge detection signal indicative of the charge induced on the electrode assembly as the electrode assembly is selectively exposed to the electric field.

47. An electric-field meter for measuring at least one of a magnitude and polarity of an electric field, comprising:

a housing at least partially constructed of a conductive material, the housing defining a retaining space;

an electrode assembly on the housing and selectively exposed to the electric field;

a shield assembly for alternately covering and exposing the electrode assembly to the electric field;

a movement assembly having a source of motive force and a linkage operably connected to one of the shield assembly and the electrode assembly for alternately covering and exposing the electrode assembly to the electric field;

a position detection assembly for monitoring the position of at least one of the shield assembly and the electrode assembly and providing a position detection signal indicative of the position of one of the shield assembly and the electrode assembly, the position detection assembly comprising:

a first element mounted to one of the shield assembly and the electrode assembly;

a second element mounted in a known relationship to the predetermined path of the first element such that upon sweeping the first element near the second element, the second element interacting with the first element when the first element passes near the second element, at least one of the first and second elements providing signals indicative of the position of at least one of the shield assembly and the electrode assembly; and a detect circuit receiving signals from one of the first element and the second element, the detect circuit output being indicative of the position of at least one of the shield assembly and the electrode assembly; and a charge measurement circuit receiving charge on the electrode assembly, the charge measurement circuit providing a charge detection signal indicative of the charge induced on the electrode assembly as the electrode assembly is selectively exposed to the electric field.

* * * * *